United States Patent [19]

King et al.

[11] Patent Number: 5,080,455

[45] Date of Patent: Jan. 14, 1992

[54] ION BEAM SPUTTER PROCESSING

[75] Inventors: William J. King, 9 Putnam Rd., Reading, Mass. 01867; William J. King, Reading, Mass.

[73] Assignee: William James King, Reading, Mass.

[21] Appl. No.: 657,616

[22] Filed: Feb. 20, 1991

Related U.S. Application Data

[63] Continuation of Ser. No. 194,819, May 17, 1988, abandoned.

[51] Int. Cl.$^5$ .................................................. G02B 5/22
[52] U.S. Cl. ..................................... 359/350; 427/162; 427/165; 359/580; 359/586; 359/900
[58] Field of Search ................ 350/164, 165, 166, 1.1; 65/30.1, 31; 427/162, 164, 165, 166

[56] References Cited

U.S. PATENT DOCUMENTS

| | | | |
|---|---|---|---|
| 3,714,013 | 1/1973 | Rairden, III | 65/30.1 |
| 3,869,322 | 3/1975 | Cuomo et al. | 357/16 |
| 3,895,155 | 7/1975 | Shukuri et al. | 350/582 |
| 3,909,119 | 11/1975 | Wolley | 357/20 |
| 3,962,062 | 6/1976 | Ingrey | 350/164 |
| 4,142,958 | 3/1979 | Wei et al. | 204/192.11 |
| 4,540,914 | 9/1985 | Maple | 427/70 |
| 4,778,731 | 10/1988 | Kraatz et al. | 350/1.1 |
| 4,837,044 | 6/1989 | Murkarka et al. | 427/162 |

Primary Examiner—Rodney B. Bovernick
Assistant Examiner—J. P. Ryan
Attorney, Agent, or Firm—Lahive & Cockfield

[57] ABSTRACT

Surface treatment of a substrate by ion beam sputtering (IBS). The sputtered material impacts on the substrate with a kinetic energy which may be several orders of magnitude higher than in conventional sputter deposition techniques, and material is deposited along a path with high energy directed substantially normal to the target surface, allowing precise control of deposition conditions.

Novel treatment processes with IBS sputtering include coating or activating of circuit board holes, alloying or transformation of surface chemistry, and the deposition of metallic, crystalline or large-molecule coatings which are intimately bonded to a crystalline or amorphous substrate. Special homologous and graded coatings allow the repair of lattice damage in crystalline substrates, and permit the formation of stress free and crystalling layers, and other coatings with diverse electrical, optical, chemical or other physical surface properties.

20 Claims, 14 Drawing Sheets

ION BEAM SPUTTER PROCESSING

This application is a continuation of application Ser. No. 194,819, filed May 7, 1988, now abandoned.

TECHNICAL FIELD

The present invention relates to industrial materials processing and the production of thin films, and relates in particular to processes and apparatus for the treatment of material by bombardment with ions or by the deposition of ion beam sputtered (IBS) material.

Such processes are carried out in a vacuum, which provides relatively long path lengths for ions to travel from an ion source to a target, and for sputtered material to travel from an ion-bombarded target to a substrate.

Prior industrial ion bombardment processes have generally been in the area of low energy ion sources. In this area, a number of compact ion sources have become available for carrying out processes such as sputter cleaning and coating. Efforts to improve the efficacy of these devices have been directed to maximizing the current density of the ion beam. These low-energy ion sources are promoted as capable of producing ions having an energy up to perhaps fifteen hundred or two thousand volts, although they are generally operated at energies on the order of tens to several hundreds of volts. Examples of such low energy ion sources are shown in Kaufman et al., U.S. Pat. No. 3,969,646; 3,952,228; 4,471,224 and 4,259,145; and also in the product literature of companies such as Commonwealth Scientific Company of Alexandria, Va.

At the other extreme from these low energy, high current density sources, are high energy sources, which may produce an ion beam one-half centimeter or so in diameter at ion energies up to forty or fifty kilovolts. A common source of this type is a duoplasmatron ion generator and an einzl lens assembly for providing a collimated beam. This is a suitable research tool, but because of its limited beam size, is of limited use as an industrial process machine. Perhaps for this reason, applicant is not aware of large-area or large throughput industrial applications of high energy ion beams. While the creation of large area high energy ion beams is theoretically possible, and high energy designs have been explored to some extent in connection with NASA inquiries into ion rocket thrusters, there does not appear to be awareness among workers in the industrial field that broad beam high energy ion bombardment is technologically feasible or offers useful industrial potential.

This situation contrasts significantly with the more accessible area of low energy ion bombardment, which has been recognized as useful for sputter cleaning and for performing certain sputter coating processes. For low energy ion processing, the problems of providing high ion flux, suitable geometries, and constructions for reducing contamination and the like have been addressed. However, success in the low energy ion beam area has lead researchers to focus on the processes and effects achieved in the low energy range, at ion kinetic energies in the tens or hundreds of electron volts. Applicant has performed investigations into the large scale treatment of substrates by ion beam sputtering under sputtering conditions which differ from those characteristics of either the low energy high current or the high energy low current IBS techniques of the prior art, and has found a number of new processes of industrial utility.

SUMMARY OF THE INVENTION

The invention contemplates the surface treatment of Substrates by high impact-energy deposition processes wherein material is sputtered from a target by bombarding the target with ions which have preferably been accelerated to high energies, e.g., one to fifty kilovolts or more. At these ion energies the number of particles sputtered per ion may be large, so that relatively high deposition rates are obtained without high ion currents. This avoids the secondary collisions of sputtered material attendant on the high plasma densities or ion densities of the prior art, which heretofore have impaired sputtering trajectories and degraded material transport processes by generating excessive thermal energy. The sputtering is carried out in a relatively hard vacuum, at a pressure of under approximately $10^{-4}$ Torr. The resulting sputtered material impacts on the substrate with a kinetic energy which may be several orders of magnitude higher than in sputter deposition techniques conventionally employed in industrial processes, and material is deposited along trajectories having a substantial component normal to the target surface, allowing precise control of deposition conditions.

Novel treatment processes developed with such IBS sputtering include coating or activating of high aspect circuit board holes, alloying or transformation of surface chemistry, and the deposition of metallic, crystalline or large-molecule coatings which are intimately bonded to a crystalline or amorphous substrate. Special homologous and graded coatings allow the repair of lattice damage in crystalline substrates, and permit the formation of stress free layers and crystal films, as well as coatings for achieving diverse electrical, optical, chemical or other physical surface properties.

These and other features of the invention will be understood in part from the following descriptions of specific examples and related discussion, together with illustrative figures, as set forth below.

EXAMPLE 1

The problem of producing an electrically conductive coating on the insides of holes, particularly through-holes of multi-layer printed circuit boards (PCBs), has long presented difficulties. The current industrial practice is to electroplate the boards. However, in electroplating, the less accessible hole walls receive a coating at a much slower rate than the surface, and this factor dictates extra care in masking and hole plating steps, solvent activation steps, or plating for an extra time so that the board surface receives a thicker coat than necessary in order to achieve a sufficient covering in the hole. Electroplating also results in poor adhesion on the hole interior.

Applicant has found that by sputtering material from a target with a high energy ion beam, it is possible to sputter deposit material at relatively high rates onto the interior walls of relatively deep, small-diameter holes. Specifically by directing an ion beam at a target so that sputtered material is energetically ejected from the target and impinges on a PCB with an energy of between approximately two to two hundred electron volts, material is tenaciously deposited in the hole interior.

Figure 1:
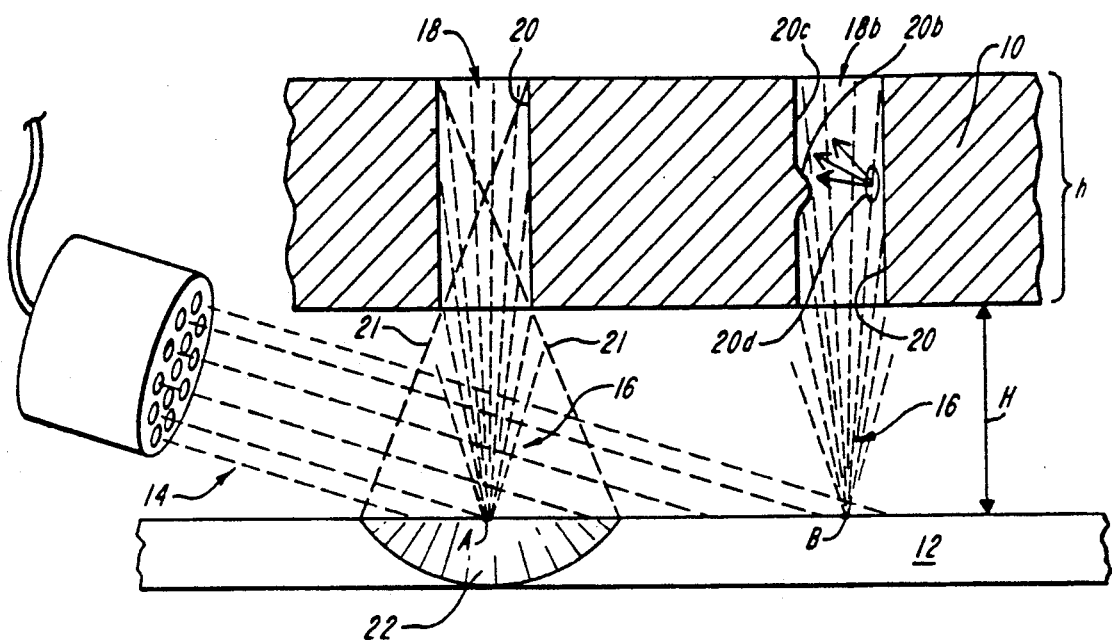
FIG. 1 shows IBS treatment of circuit board holes according to one aspect of the invention.

FIG. 1 illustrates such treatment. A PCB 10 to be treated is placed in a vacuum chamber opposed to a target 12 formed of material to be sputtered onto the board. A beam of ions 14 bombards the target, causing material to be sputtered therefrom. At each point where the beam 14 strikes, sputtered material is emitted in a plume or spray 16 directed in an angular range distributed about the normal to the target surface. For purposes of illustration, the plumes from two points A, B are shown. It will be understood, however, that a sputter-emission pattern such as illustrated at points A and B exists at each point of the target struck by the ion beam. As ion beam 14 blankets a broad region of the target 12, the summed sputter-emission sprays provide a broad curtain of material having a large component of motion in the direction normal to the target.

As illustrated, PCB through-holes 18 each receive sputtered material radiated from an underlying region of target 12 generally opposed thereto along a line of sight from within the hole. Since the ion-beam sputtered material proceeds in a line-of-sight trajectory, it strikes the PCB with a kinetic energy which may be distributed substantially in the range of ten to a hundred electron volts or more. Thus, despite the low angle of incidence between the sputtered plume and the hole wall 20, the material implants or firmly bonds to the inner walls 20 of the holes. Illustratively, a hole 18 receives material sputtered from a region 22 about point A, where the size of the region varies inversely with the aspect or depth of the hole, which determine the shadow lines 21. The board 10 may be spaced a considerable distance from the target 12 (e.g., at a spacing of several feet) while maintaining a relatively good ratio of hole-deposited to face-deposited material, in view of the highly directed paths of plumes 16.

Setting the hole diameter and board thickness to d and h, and the target-to-board distance to H, it will be seen that the bottom of a hole 18 receives sputtered material only from a relatively small region 22 which extends a distance of approximately (d/h)H about the point A of the target. Preferably an ion beam is used which has substantially uniform intensity over a broad region of the target, or if the beam has "hot spots" of greater ion intensity, these are positioned directly opposed to the holes 18 in order to effectively treat the through holes. The target-to-board spacing is set large to increase the rate of deposition on the hole wall. The process chamber pressure is maintained at approximately $5 \times 10^{-5}$ Torr.

By sputtering relatively energetic material in a line-of-sight material deposition process, even relatively high aspect holes, having a ten-to-one depth-to-width ratio, have been plated. FIG. 1 also shows a further aspect of the process, whereby a second hole 18b located over sputtering region B is coated.

Hole 18b has a somewhat irregular interior surface, such as commonly occurs due to drilling imperfections, misalignment of board layers and the like, so that a protrusion 20b on the hole wall 20 blocks the sputtered material from reaching a region 20c of the wall. Nonetheless, material of beam 16 striking the exposed region 20d of the hole wall sputters off coating material therefrom in a secondary process along a path which directly reaches the shadowed region 20c. Thus, by employing sputtered material having a large kinetic energy the secondary sputter emission allows coating of even rough and irregular hole walls. The above-noted secondary sputtering serves to uniformize the coating thickness, as well as fill pits in the wall. In a preferred treatment method, by sputtering material from two targets, one arranged on each side of the board, better coverage of the hole wall is achieved. A uniform coating of the hole wall from top to bottom may also be achieved by turning the board over between multiple coating steps with the target on one side.

Figure 2A:
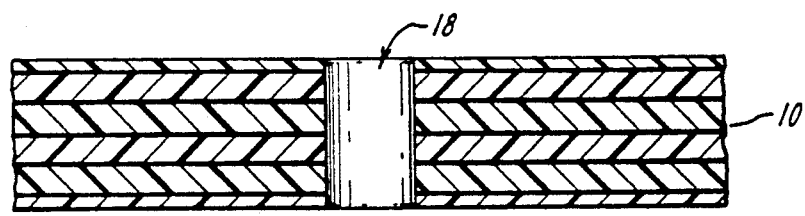
FIGS. 2(a)–2(e) show details of a hole treating process illustrated in FIG. 1.
Figure 2B:
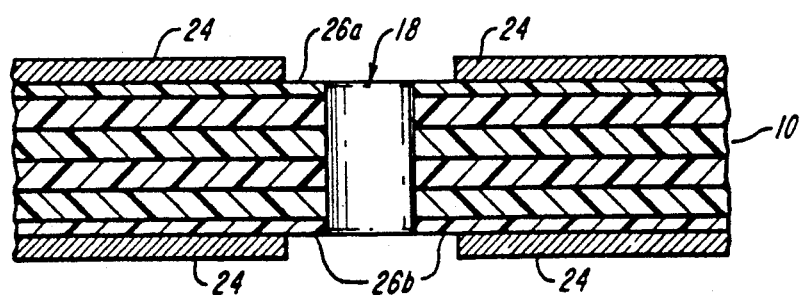
Figure 2C:
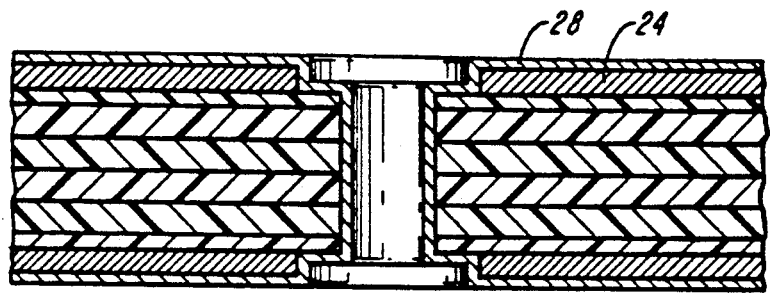
Figure 2D:
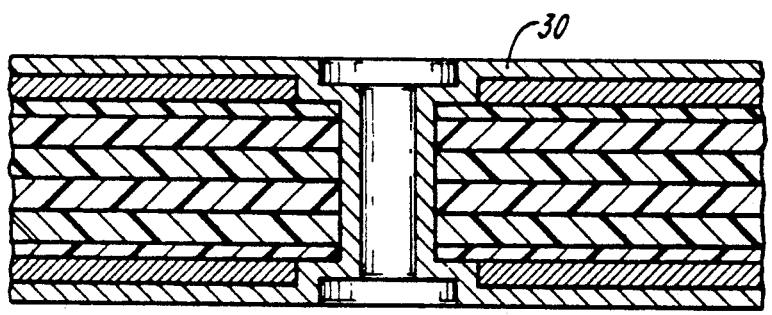
Figure 2E:
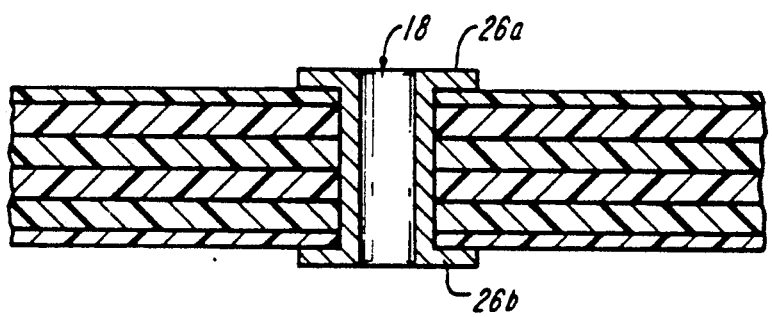

FIGS. 2(a)-(e) illustrate a preferred hole plating method according to the invention, wherein sputter-coating is employed to deposit a thin "activating" layer, e.g. a copper layer under one-half mil thick and in some cases as thin as several hundred angstroms, which is then electroplated to a thickness of several mils. By thus rendering the hole surface electrically conductive, the uniformity of subsequent copper deposition in a conventional electroplating process is vastly improved. FIG. 2(a) shows a multi-layer board 10 in which a through hole 18 has been drilled. FIG. 2(b) shows a photoresist mask 24 on both sides of the hole, which leaves exposed the interior of hole 18 and an adjoining region 26a, 26b on each side. The board 10 is passed through a sputter-coating chamber where a thin metal layer 28, illustratively of copper, is deposited on all exposed surfaces, as shown in FIG. 2(c). This metallized layer is then electroplated to the desired thickness, providing a layer 30 of substantially uniform thickness in the hole 18 and on the board surface (FIG. 2d). The resist is then stripped, leaving a plated hole 18 with adjoining metallized regions 26a, 26b.

Applicant has found that the sputter deposited layer 28 adheres tenaciously to the board. After sputtering, the undesired metal overlying the resist, may be mechanically stripped, conveniently separating from the metallization of the hole at lands 26a, 26b, and the residual resist is removed.

In yet a further preferred embodiment, applicant has found that by pre-treating the masked board, prior to the step (c) of FIG. 2, with a sputter-coating of titanium, the adhesion of the circuit metal to the board is greatly enhanced.

In a more general but related process, applicant has found that the sputter deposition by high energy IBS results in highly adherent sharply defined faithful coatings of circuit features when employed with a photoresist or similar mask. The deposited material adheres tenaciously to the unmasked portion of the substrate, and since the photoresist mask has very low bond strength, boards or circuit elements which are metallized by this technique may be mechanically stripped, rather than etched. Thus, by high energy ion-beam sputtering, one achieves a board or device fabrication process free of toxic chemicals and liquid waste used in prior art etch-based fabrication processes. By using a thermally dissociating photoresist, chemical process steps for removing the residual photoresist are also avoided.

EXAMPLE 2

In this example, high-energy sputtering of titanium as a transition, alloying, or intermediate bonding layer enables a number of useful new processes.

a) A 300A-500A thick layer of elemental titanium was sputter-deposited onto a copper substrate by ion beam sputtering under vacuum conditions controlled such that the sputtered material was directed to the substrate. The substrate was then heated for a few minutes in a vacuum to 950° C. to achieve a surface of Ti-Cu alloyed to some depth. The resulting alloyed surface proved to be resistant to oxidation at temperatures of several hundred degrees Celsius, and could be soldered without fluxing even after exposure to atmospheric conditions at that temperature. The process thus produced an oxidation resistant surface layer on the copper. More generally, the invention contemplates such surface treatment of copper pipes, electrical contacts and leads, and circuit connectors, so that such articles of commerce may be soldered without the reactive fluxes previously required for soldering, may be stored for long periods of time or may enjoy extended service lifetimes without excessive oxidation.

b) A 1000A thick layer of elemental titanium was sputter-deposited onto a ceramic $Al_2O_3$ substrate, followed by a 1000A thick boundary layer of material which was graded from pure titanium to pure nickel. The graded layer was then overcoated by sputtering from the nickel target alone to achieve a (0.36) mil layer of pure nickel. For a small area, a graded coating as described may be achieved by sliding a nickel target to progressively cover a titanium target during the sputtering so that the sputtered material forms a deposited layer, having progressively changing proportions of titanium and nickel which vary continuously with coating depth. In a preferred production system, such graded coating will preferably be achieved by moving the substrate between partially overlapping sputter regions of two distinct target substances.

The ceramic substrate sputter-metallized in this manner proved to be brazeable with copper/silver braze at a relatively low temperature, approximately 850° C. The sputtered titanium provided an excellent implanted bond into the underlying ceramic, and the nickel served to inhibit the titanium from leaching into the braze. With a thinner layer of nickel (0.24 mils) a less consistent braze was achieved. This was believed to be due to excessive dissolving of the titanium from the board surface. The nickel layer was made thick enough to prevent the nickel from entirely going into solution in the braze. The use of electroless nickel, or electrodeposited nickel for the nickel coating is expected to allow a thinner nickel layer. The titanium was believed to reduce the underlying substrate and to alloy well with all other components, thereby assuring a good bond. The process was confirmed on $Al_2O_3$ circuit boards, on high density $Al_2O_3$ boards, and on beryllium oxide ceramic substrates. Extremely high pull strengths were measured for the resulting braze, in the range of 7,500 psi for the beryllium oxide substrate, and 10,000–15,000 psi for the alumina board. Similar bonding results are observed for the metallization process on aluminum nitride, and are expected for virtually all ceramics.

When tantalum was substituted for titanium, less consistent results were achieved. While a good braze to the ceramic substrate was achieved with tantalum in some cases, the Ta layer appeared to prevent a braze bond when the Cu-silver braze leached through the nickel. The alloying and substrate reducing properties of titanium generally gave stronger more consistent braze bonds. Although a graded Ti-Ni layer was deposited over the Ti activation layer, a more abrupt or a direct transition to a pure nickel coating is also expected to also be effective. Substitution of tungsten instead of titanium is expected to provide results comparable to those obtained using tantalum, but the copper-tungsten layer strength is less.

EXAMPLE 3

Using ion beam energies above 5 KeV to bombard a target with positive argon ions, molecular material from an $Al_2O_3$ target was sputter deposited on a substrate. More generally, high energy IBS was employed to sputter targets of a great number of materials to achieve novel coatings. Zinc sulfide was deposited in an optically flat film onto zinc sulfide and onto zinc selenide, and was also deposited in a polycrystalline form on zinc selenide.

It has been empirically taught, apparently based on observations of low energy ion bombardment processes, that ion-beam sputtering causes a destructive fractionation or molecular breakdown of material ejected from the target. Applicant has found that, on the contrary, large-molecule material may be sputter-deposited with its molecular bonds intact by using an energetic ion beam. Although for some materials, the gross temperature of the substrate and target must be cooled below the breakdown temperature of the substance being sputtered, this factor tends to affect achievable material deposition rates and the stability of sputter-deposited material, but not the applicability of the sputter deposition process. The next several specific examples illustrate the range of such processes for forming novel films of organic and inorganic, crystalline and amorphous material.

EXAMPLE 4

A beam of argon ions accelerated to an energy of approximately 15 kV was directed at a target consisting of a cured epoxy material having polymeric molecular structure, and material was sputtered from the target onto a circuit board. By maintaining the beam current below approximately one tenth $mA/cm^2$, and cooling the target and substrate, a uniform film having slight color shift from, and electrical, physical and chemical properties superior to, the original target material was deposited. The energy of the ion beam was thus sufficient to sputter off epoxy moieties of relatively large molecular size, which apparently rejoined under the energy of impacting on the substrate to form a long chain polymer coating comparable to the original material. Applications contemplated for this technology include the fabrication of circuit boards or circuit elements in which features formed by deposition of an epoxy or similar large molecule material function as insulators, resistors or dielectric elements, as well as constituting chemical surface protection for the underlying bulk material.

EXAMPLE 5

The epoxy target of the preceding example was replaced by a target composed of a glass used to make printed circuit boards. The object was to replace the glass board fabrication techniques of the prior art. Conventionally a glass frit is employed as a material for forming multi-layer circuit boards in a process which involves screening or otherwise coating a pattern of glass frit over the conductive pattern of a circuit board, and firing the coated board to fuse the frit into a solid glass layer. Three or more frit coatings are generally required to achieve a competent insulating layer due to the holes and film defects characteristic of the frit coating and firing processes.

According to this aspect of the invention an argon ion beam was accelerated to an energy of about 15 kV and directed at a target of a silica alumina glass; the resulting sputter-ejected material formed a continuous, thin, dense film on a substrate located opposite to the target. The film deposited in this manner is a clear glass, rather than an opaque material like a fused alumina starting material, and has excellent electrical insulating properties, and is essentially glassy, i.e. continuous and free of holes and defects. Thus, by ion-beam sputtering the insulating glass layer, high-temperature firing is entirely eliminated from the board fabrication process.

In fabricating circuit boards according to this aspect of the invention, one is not restricted to targets of the frit materials used in conventional heat fabrication processes. One may sputter the coating material from an $SiO_2$ target, or preferably may sputter material from a target having defined proportions of different materials selected to achieve a particular physical property. Boron nitride, discussed below, may be sputter deposited alone to provide high thermal conductivity, low dielectric constant, and extreme hardness. More generally, as an example, to deposit a thin, dense coating layer, a low dielectric constant is desirable. When it is desired to sputter a highly thermally conductive layer, an appropriately low dielectric constant may be achieved in a deposited layer of high conductivity by simultaneously sputter depositing a material of low dielectric constant. For example, by sputtering from a target having an approximately 3:1 ratio of $SiO_2$ ($\epsilon=3.8$) and AlN ($\epsilon=$approx. 8.9), one makes a coating layer with ($\epsilon=$approx. 5.0). The addition of AlN increases the thermal conductivity of the coating, and the $S_iO_2$ maintains a low dielectric constant in the combined coating, thus resulting in a combined dense glass-ceramic board material of enhanced physical properties. Applicant has successfully sputtered aluminum nitride using a 15 kV nitrogen ion beam at $5-8\times10^{-5}$ Torr. For enhanced thermal conductivity applicant has sputter deposited films of boron nitride using a 15 kV ion beam.

Thus, the large molecule coating process by IBS according to the invention contemplates in addition to coatings of plastics or polymers, coatings of mixed multi-purpose dielectrics, ceramics, coatings compatible with ceramic hybrid circuitry, coatings of mixed materials such as a metal and a glass, an epoxy and a glass, organic with inorganic materials, or alloys not achievable by other processes.

EXAMPLE 6

This example combines processes of several preceding examples to illustrate the fabrication of a multi-layer printed circuit board having a novel through-hole construction, using only IBS deposition techniques. FIGS. 3(a)-3(e) show the simplified steps of such a process, wherein a substrate 40, such as a circuit board of conventional material, is successively treated to produce a completed multi-layer board 60 having conductive leads or circuit elements which are to be later interconnected by soldering a wire 50 passing therethrough. For clarity, the steps of masking with a photoresist, and of stripping sputtered material and photoresist from masked areas are not shown, although it will be understood that such preparation and finishing steps, as described in Example 1, may be used for each of the illustrated sputter-deposition steps shown in FIG. 3 to define a pattern of conductive or dielectric material.

Figure 3A:
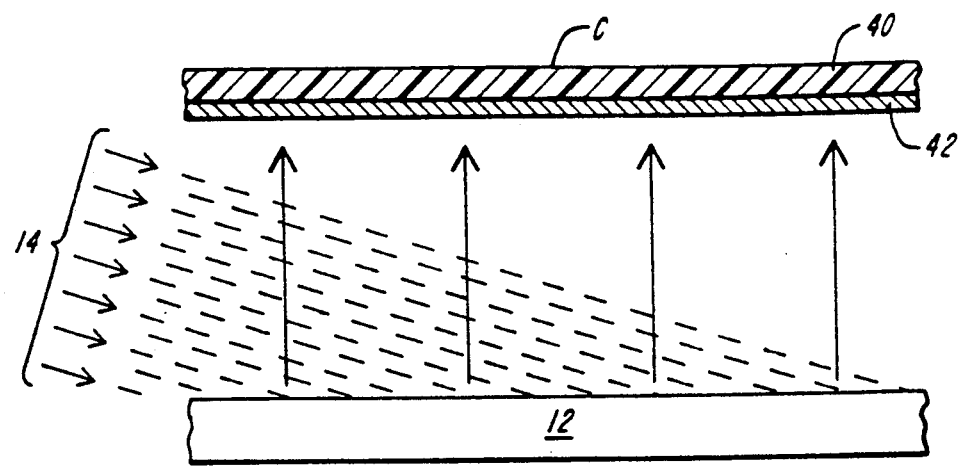
FIGS. 3(a)–3(f), and 4 illustrate a process of forming multi-layer circuit board connections.

FIG. 3(a) shows a bare board 40 receiving an initial surface pattern or continuous film 42 of a conductive material, e.g., copper. A patterned layer 42 may be used for conductive connections, or for forming passive circuit elements such as a tuned antenna; a continuous film may be desired if layer 42 is to be a ground plane or the like. The reference letter C denotes a fixed point on the substrate where a through hole will be drilled; subsequent steps will be performed to maintain alignment with point C, which may also be a pre-drilled hole.

Figure 3B:
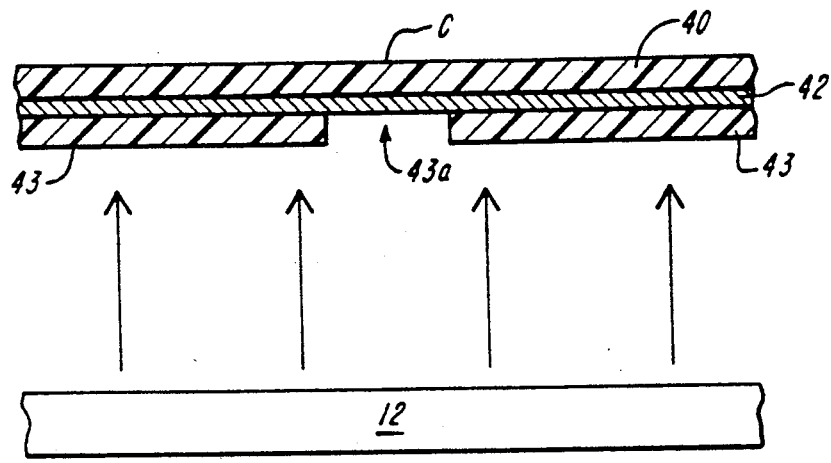

FIG. 3(b) shows a next layer 43 deposited over layer 42. Layer 43 is an insulating intermediate board layer, such as the blue glass or the glass/ceramic layer described in Example 5, and is deposited in a pattern to leave a through-opening 43a to the region C. Layer 43 may be formed by masking region C, sputter-coating the board, and stripping the sputtered layer from the masked regions, or it may be formed by screening in a conventional manner.

Figure 3C:
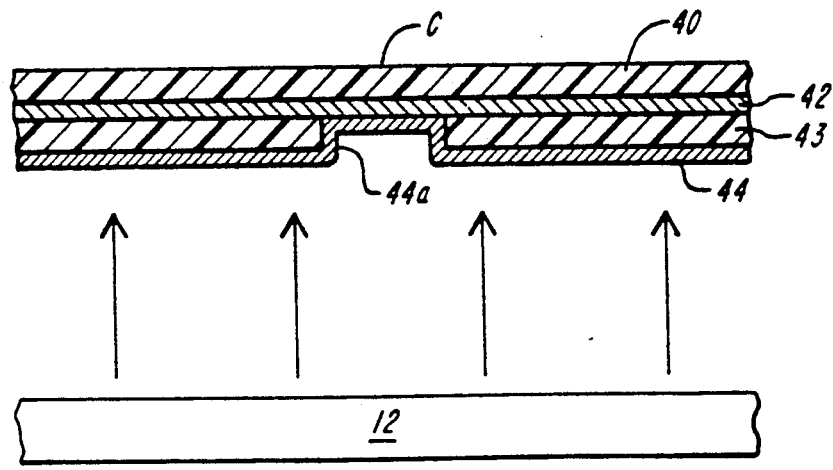

FIG. 3(c) shows the next sputter-deposited layer, consisting of a pattern of conductive material 44. This layer extends up to the opening 43a, and at least some of the conductive metal extends over the edge and along the inner face of opening 43a, coating the hole wall and floor with a conductive coating 44a.

Figure 3D:
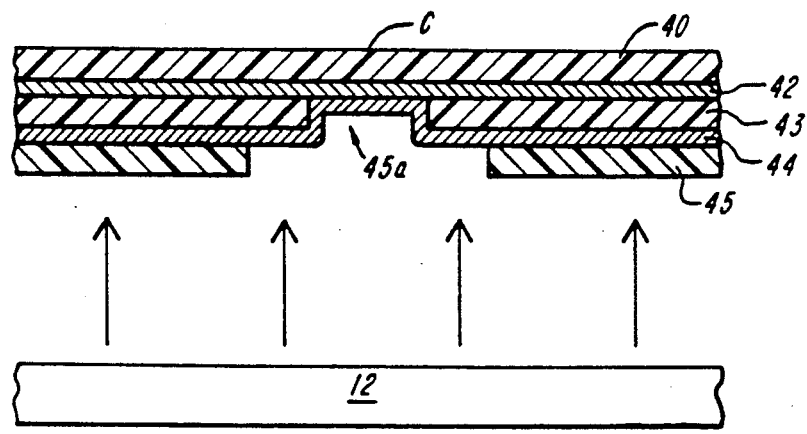
Figure 3E:
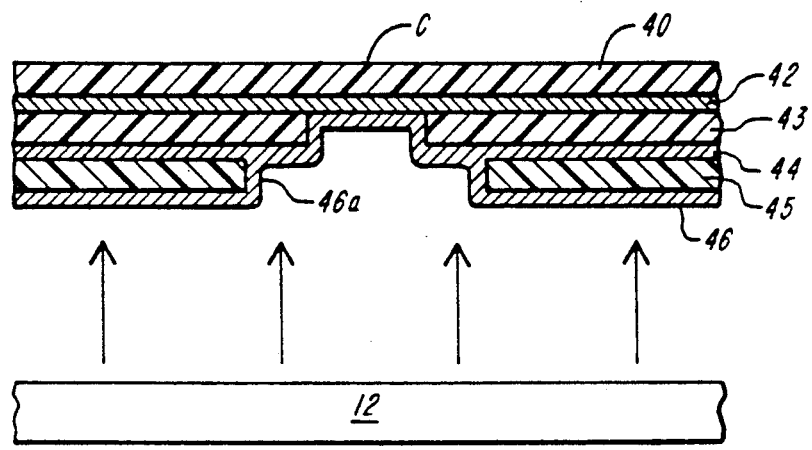
Figure 3F:
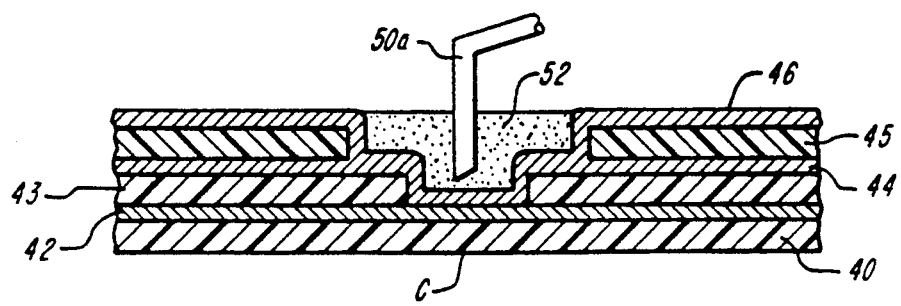

FIGS. 3(d) and 3(e) repeat the steps illustrated in FIGS. 3(b) and 3(c), with a second insulating layer 45 forming an opening 45a larger than opening 43a and also centered over region C, and the next metallizing layer 46 resulting in a partial metallizing 46a of the stepped opening defined thereby. The process may be continued to define further layers, as desired for a given circuit board construction, with intermediate layers formed at each of many desired hole locations on the board, each comparable to region C, and each contacted by a conductive layer at one or more levels. The hole at each level may be approximately one-half mil larger diameter than at the preceding level.

Figure 4:
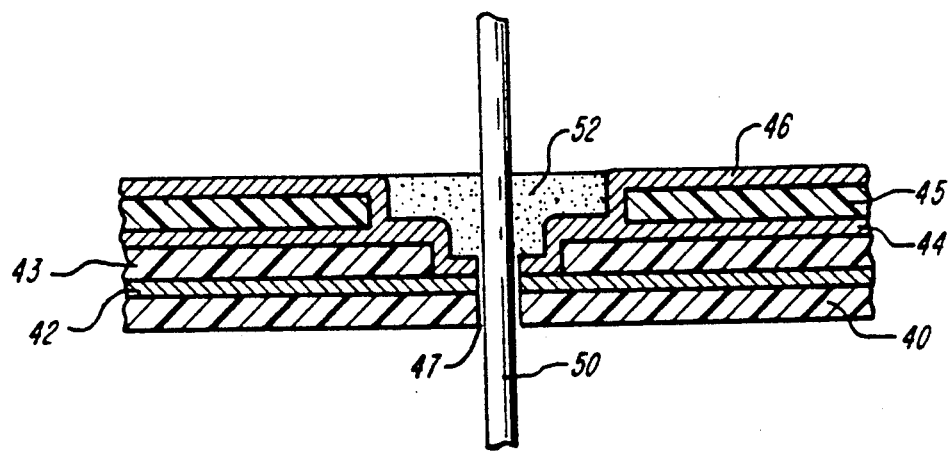

FIG. 4 shows the completed metallized board in an orientation inverted from that of FIGS. 3(a)-(e). A hole 47 has been drilled at region C to provide a through opening for a conductor. The resulting step-like or funnel-shaped opening formed by the openings of successive layers 45a, 43a, and hole 47 constitutes a metallized cup-like reservoir which enhances the ease of soldering. The hole walls at each level are conductively interconnected to the overlying and adjacent conductive patterns by the metallization steps, so that when a wire 50 is soldered thereto by solder 52, circuit contact to each level is reliably achieved.

By way of alternative construction, FIG. 3(*f*) shows the multi-layer circuit interconnection of FIG. 3(*e*) employed in a surface mount board. In this embodiment, no through hole is drilled at position c but rather a circuit element or land 50*a* is connected from one side only of the completed board, with solder 52 in the terraced sump forming a large-surface redundant conductive interconnection of the various exposed metal layers.

EXAMPLE 7

Figure 5:
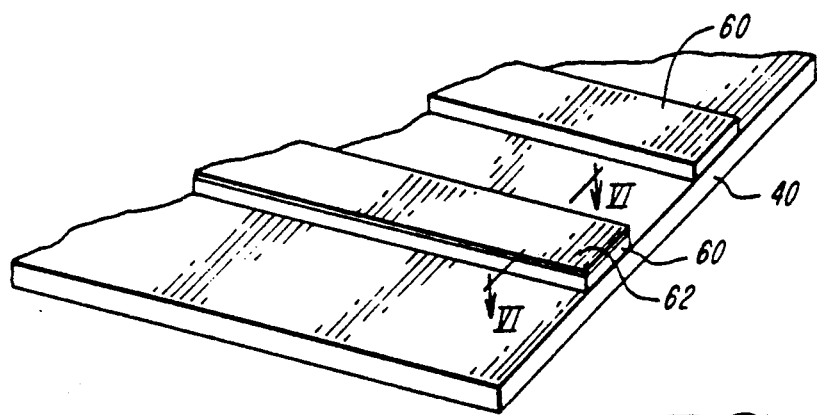
FIGS. 5 and 6 illustrate a novel coating process form forming solderable metal surfaces.

One aspect of the various industrial processes described above is that thin films formed of arbitrary materials, and defined compositions of mixed materials, are deposited in a desired order on a relatively low temperature substrate. In one process according to the invention, this ability to form strata of defined composition is employed to produce a flux-free solderable circuit connection, such as a land on a PCB. FIG. 5 illustrates such a connection, in a partial cutaway perspective view.

As illustrated in FIG. 5, a circuit board or circuit element designated 40 has a land formed of a thin conductive layer 60, such as copper, for providing a circuit connection by soldering to a separate conductor. In the prior art, connections to such lands are accomplished by fluxing the land and quickly contacting the land and external conductor with molten solder. A problem with this construction is that, when the land remains in contact with molten solder too long, the corrosive flux and high temperature solving effects can dissolve the land and lead to ionic migration. Also, after soldering, the flux must be removed, since remaining traces of flux can corrode the land, shortening its lifetime.

Figure 6:
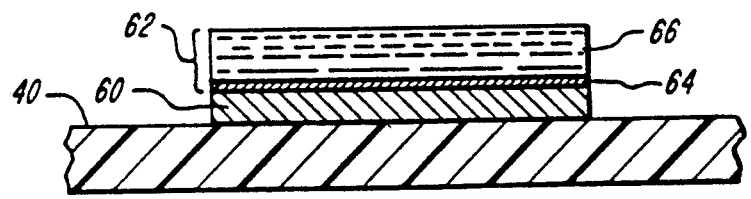

Applicant has found that by depositing a suitable coating 62 over land 60 a solder joint is dependably achieved by dipping in molten solder without using a flux. One suitable coating process is described with reference to FIG. 6, wherein the land and substrate of FIG. 5 are shown greatly enlarged, with a preferred coating layer 62.

Layer 62 comprises a first layer 64 deposited directly on the copper land 60 as a barrier to prevent copper from dissolving into the molten metal soldering pot, and a second layer 66 deposited on layer 64 which is adapted to form a strong bond with solder when dipped, without flux, into the soldering pot. Each of layers 64, 66 are deposited by IBS as described above. Preferably, layer 64 is a nickel layer, and layer 66 is a layer of graded composition which varies from the material of layer 64 at its bottom to a soft solder composition, such as a 63/37 Pb-Sn solder, at its surface. This is indicated in the Figure by the graded shading of layer 66 with depth of coating. Alternatively, layer 66 may vary from a very hard solder at its bottom to a soft solder at its upper surface. The hard solder is selected to be substantially insoluble in the solder pot.

With this composition, when the treated board is immersed in solder, the outermost portion of layer 66 quickly melts and dissolves. At some intermediate level of layer 66, the graded coating has a melting point above the temperature of the solder pot, and the solder forms a bond at that level, while the lower portion of layer 66 remains unmelted as a solid barrier to prevent dissolution of land 60.

When a solder of very high melting point is used for the lower portion of layer 66, the barrier layer of nickel may be eliminated. The nickel may also be eliminated if copper land 60 is relatively thick, so that dissolution of the land is not a concern.

The foregoing surface treatment provides a material surface which is directly solderable without flux. Moreover, because ion-beam sputtered material forms a tenacious bond with a broad range of substrates, the process may be applied to articles other than circuit boards or elements. In particular, staple articles such as stainless steel tube or pipe and fittings may be treated according to the above described methods to produce directly sweat solderable pieces. The layer of sputter deposited material can be well under (0.001) inches and still effectively define a barrier in a directly solderable layer, as described above, of dimensions compatible with normal fittings.

EXAMPLE 8

When printed circuit boards are subject to temperature variations or mechanical strain cycles, the conductive or metallic portions of the board may separate from the board body, resulting in circuit failure. Applicant has found a method of achieving a strong physical bond between a copper conductive layer and a substrate which is illustratively a Kapton circuit board. Kapton circuit boards fabricated according to this method have the combination of flexibility with high integral strength, so that temperature-induced and mechanical stresses do not result in circuit-board bond failure.

A Kapton sheet substrate approximately one to five mils thick was placed opposite a titanium target to receive material sputtered off by a 15 kV beam of argon ions, which was incident on the target at approximately sixty degrees from the normal, in a vacuum of $5 \times 10^{-5}$ Torr. After a coating equivalent to one thousand angstroms of Ti was sputtered, a copper target was advanced into the ion beam over the titanium target and a layer of copper approximately one mil thick was deposited on the substrate over the Ti. Pressure in the deposition chamber was maintained low, so that sputtered material followed a straight trajectory to the board and impacted on the board with an estimated kinetic energy distribution in the range of 2 eV to 200 eV.

The resulting flexible clad sheet had the circuit appearance of a conventional printed circuit board or sheet, and could be processed by masking, exposing and etching according to conventional circuit board pattern forming techniques. Repeated 180° flexing of the sheet produced no observed separation of the conductive layer from the substrate. It is believed that the initial Ti layer enhanced penetration and also mediated bonding to the heterogeneous polymer substrate, and also bonded well with the copper atoms. Since titanium forms eutectic combinations or alloys with various metals (e.g., aluminum at about 660° C., nickel at about 955° or about 770° C., copper at about 885° C. or about 798° C.), the process is believed applicable when combined with heating to achieve enhanced contact bonds between a polymer substrate and a metal for diverse applications, including the fabrication of mirror coatings, Hall effect transducers, and electrical conductors or circuit connections. As described in Example 2 above, a similar process provides a brazeable bond to ceramics. When copper was deposited directly (without titanium)

by the same sputter process onto the Kapton boards, a very good but slightly less strong bond to the board was achieved.

A 15 kV ion beam was also used to sputter deposit a layer of titanium followed by copper to form electrodes on a PVDF piezoelectric polymer film. The substrate was cooled and beam current kept sufficiently low to prevent thermal breakdown of the piezoelectric. On a thin polymer film, the surface was first abraded to roughen it and enhance adhesion. Contacts of copper without the intermediate titanium layer were made by the same process.

When brass rather than titanium was sputtered as an initial coating below copper on a board-like substrate, a serviceable copper cladding was also achieved.

EXAMPLE 9

Aluminum nitride has been proposed as a substrate for the fabrication of ceramic circuit boards or elements, and a method for depositing aluminum nitride films would extend the range of possible devices. Example 2 above described a method for forming contacts on AlN, and Examples 3–5 described IBS techniques suitable for forming layers of an arbitrary target material using high energy ion beam sputtering. Prior art techniques for forming aluminum nitride films involve forming the film with reactive gases under special conditions. By using an energetic ion beam, e.g., a beam having an energy over five kilovolts and preferably over fifteen kilovolts, aluminum nitride may be sputtered directly from an aluminum nitride target to form coatings, in the manner described in Example 5 above. Aluminum nitride coatings between two and ten microns thick which were essentially transparent in the 1–10 μ infrared region were made by sputtering an aluminum nitride target with 15 kV nitrogen ion beam in this manner. Mixed ion beams consisting of 80–90% nitrogen, remainder argon were also used. These processes are considered valuable for the formation of optical window coatings. It is expected that boron nitride films can be made by essentially the same processes.

This example describes another technique for forming a coating of a binary compound such as AlN, wherein the compound is simultaneously formed and is sputtered in a one-step process. The process is illustrated in FIGS. 7(a) and 7(b), in which the layout of elements corresponds to that of FIGS. 1 or 2(a), with an ion beam 14 directed at a target 12, to sputter material on a workpiece 40.

Figure 7A:
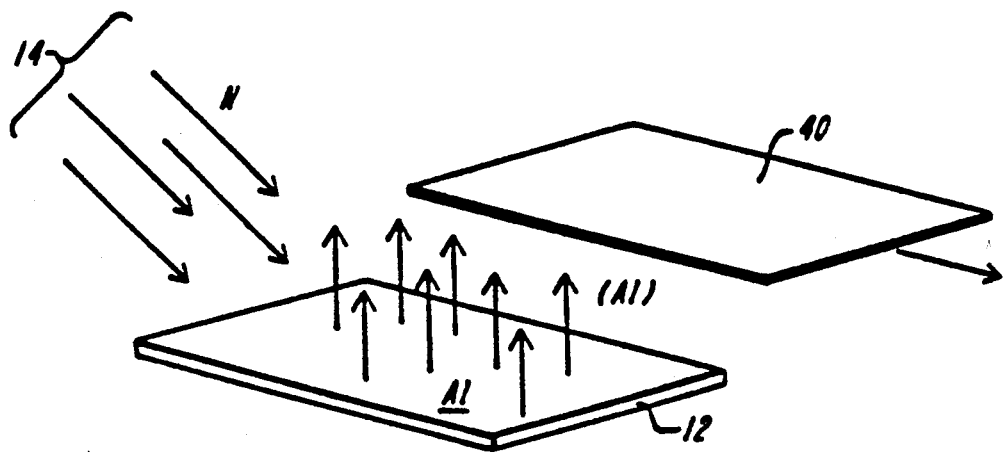
FIGS. 7(a) and 7(b) show a process for sputtering coatings of non-elemental materials.

As shown in FIG. 7(a), target 12 is aluminum, and beam 14 is composed of nitrogen ions. Beam 14 is of an energy which not only sputters material from the target, but causes the ions to penetrate, resulting in the transformation of the surface of target 12 to an aluminum nitride material.

Figure 7B:
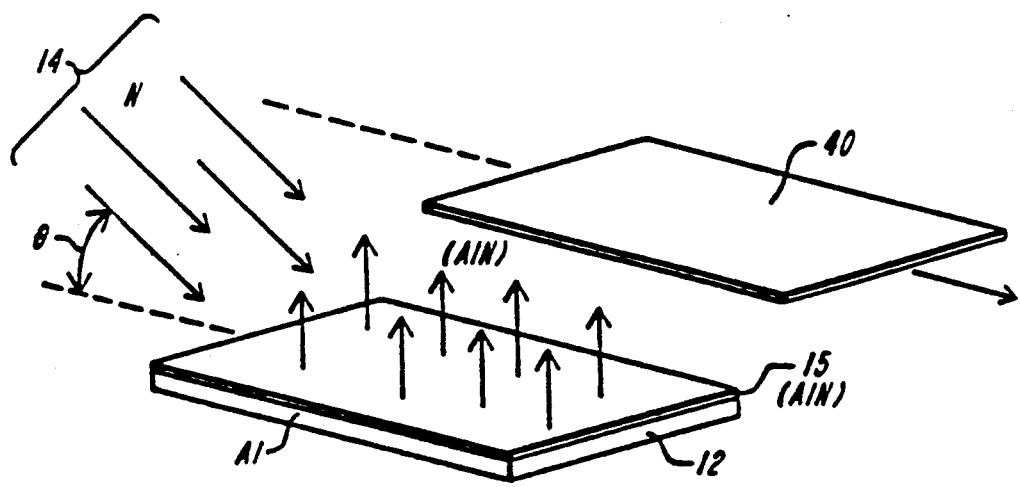

FIG. 7(b) is an enlarged detail of the arrangement of FIG. 7(a), after a certain time interval in which the beam 14 has transformed a surface layer 15 of the target to AlN. After this time, the continued bombardment of the target sputters the transformed aluminum nitride material onto the substrate 40. The rate of sputter-erosion of the target may be decreased by decreasing beam energy, and other factors may be adjusted to result in a steady state wherein AlN surface enrichment does not fall below the sputter erosion rate. A heavy noble element such as krypton may be used with a nitrogen ion beam to increase the sputtering rate. This results in an uncontaminated aluminum nitride sputter coating. Titanium nitride films were sputter deposited by a similar transformation-sputtering process, with a titanium target substituted for the aluminum target.

Prior attempts to deposit compounds or large molecule materials or to control the chemistry of a layer deposited by ion beam sputtering have generally involved the use of added reactive gases to counteract processes such as undesired surface reactions or destructive fractionation. The illustrated process achieves the formation of a film of a compound using only the components of the compound for the target, the ion beam and any residual atmosphere. A single ion beam is required, and only simple process variables such as incidence angle, beam energy and chamber pressure are changed to optimize the rates and purity of film formation, with no heterogeneous reactants being introduced.

EXAMPLE 10

It is known that direct bombardment of certain materials, such as $S_iO_2$, by an ion beam can result in a physical compression or densification of the material. Applicant has found that the deposition of sputtered material as a thin film, wherein the sputtered material impacts with an energy in the range of two to several hundred electron volts, forms a dense film wherein implantation of material causes certain compressive forces at the surface of deposit. While this implantation results in excellent adhesion, the juxtaposition of a highly compressed film on an uncompressed bulk substrate leads to localized strain. Moreover, contiguous layers of different materials having different characteristics will form an inherently unstable construction. Where, for example, the two materials have different thermal coefficients of expansion, a large temperature variation from the temperature at which the material was laid down may cause large shear forces along the layer interface or result in layer separation. Even at room temperature a sufficient stress may build up to cause mechanical failure of the substrate or interface.

In Example 2 above, a process was described for forming a continuously graded coating of material, in which a substrate of material A was coated with a layer which varied from material B to material C. The graded conductive coating served to match a desired surface property (solderability) to an initial film property (strength of adhesion).

Applicant has found that particular graded coatings eliminate stresses which would otherwise develop between their top and bottom layers of material, and may thus be deposited to provide a surface free of strain. These strain-free or strain-relieved coatings, which applicant calls "relaxation films" allow material deposited thereon to assume a least-free-energy state, e.g., a crystalline state. In theory, by depositing a relaxation film on a substrate, one may more readily form an epitaxial coating on top of the film even though the film and underlying substrate may be amorphous. Also, by depositing a sufficiently thin relaxation film over a crystalline substrate, the substrate may provide an orienting lattice for the deposit of crystalline material while the relaxation layer allows a greater lattitude in mis-matching lattice constants and as well as removing the localized stresses normally caused by the coating process.

Figure 8:
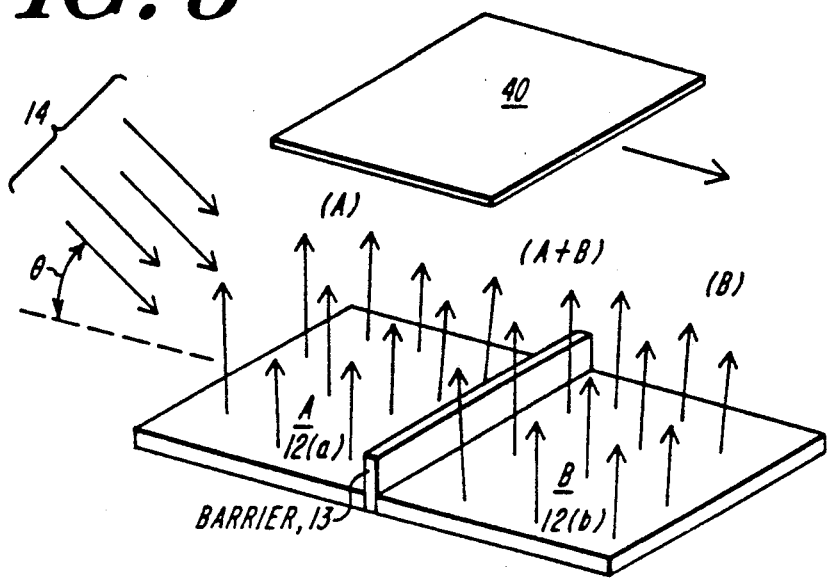
FIG. 8 shows a process for forming a stress-free coating.

FIG. 8 shows a process for forming a stress free coating. As indicated, a process apparatus moves a substrate 40 past first and second targets 12(a) and 12(b) which are bombarded by an ion beam 14 to sputter target material onto the substrate.

Figure 9:
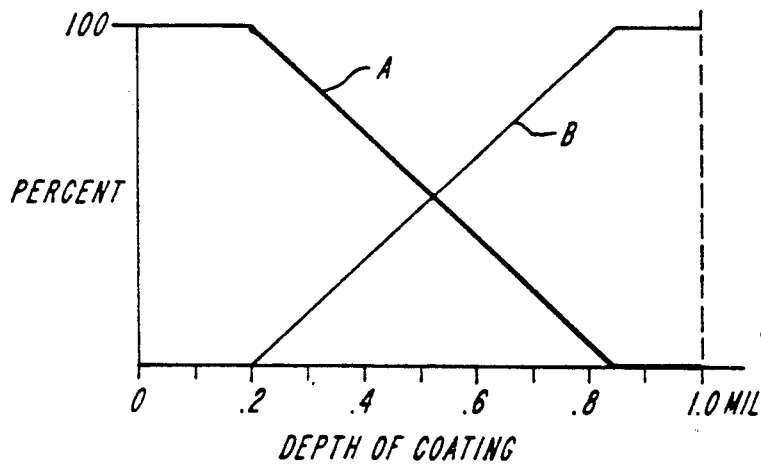
FIG. 9 is a graph of component concentration of the coating of FIG. 8.

Illustratively, target 12(a) is formed of material A, and target 12(b) is formed of material B. The targets are closely spaced such that the material sputtered therefrom forms several regions along the treatment path progressively varying from pure material A, through a transition coating zone where the A concentration is decreasing while the B concentration is increasing, to a region of pure B material. A barrier 13 serves to block highly oblique sputtered material, and to better define both the width and the material gradient of the transition coating zone. Thus, as the substrate moves, a graded coating of material is built up. Illustratively, where the substrate is moved at a speed to receive a one mil coating in passing the targets, the relative amounts of each material at depths between 0 and 1 mil are shown in FIG. 9. Reference is made to applicant's aforesaid patent application for High Energy Broad Beam Ion Treatment And Apparatus for a more detailed discussion of sputter emission trajectories and special target geometries useful in achieving the desired progressive distribution of sputtered material.

It will be understood that the two targets 12(a), 12(b) could also be replaced with a single target which has been formed such that the relative proportions of materials A and B vary from one end of the target to the other. Such a target is made by sintering from a graded mixture of powders. Alternatively, sliding targets as discussed in Example 2, or an array of targets with movable shutters may be used to achieve a desired material distribution.

In a preferred coating process, the material A is selected to be the same material as the surface of the substrate, resulting in a relaxation coating which applicant designates a "self-on-self" relaxation coating. A significant thickness of the self material, e.g. tens to hundreds of angstroms thick, is first deposited after which the material is graded to material B, as described above. The B coating may then continue to a desired thickness. By using such a coating, the additional mechanical stress introduced at the substrate-to-coating interface may be substantially reduced and relieved by flash annealing the coated or partially coated product. The annealing is generally desirable to cure lattice dislocations caused by impacts, and to relieve the compressive stresses caused by sputter-implanted atoms. In an assembly line process as illustrated in FIG. 8, such annealing may be accomplished, for example, by directing a heat source (e.g. a microwave, IR, or electron source) at the substrate, or by quickly passing the substrate through a furnace.

In particular, if the substrate is a crystalline substrate, lattice damage or implantation-induced stress caused by the sputtered material is cured by heating the substrate to a temperature below the crystal damage temperature and maintaining the substrate surface at that temperature for a sufficient time for atomic migration at the surface layer to fill lattice dislocations. Temperatures under approximately five hundred degrees for silicon, and under approximately six hundred degrees for copper, are sufficient. The depth of the major crystal damage layer for sputtered material is quite small, e.g., under a few angstroms. Consequently, the underlying crystal lattice can influence molecular motion in the layer, so that any dislocations are readily cured by migration. Heating times of a few seconds may suffice for coatings of a mil or less. When such a self-on-self relaxation layer is annealed, the substrate surface becomes a homogeneous surface, and the outer surface of the graded coating layer becomes a stress free surface, suitable for the large-area growth of crystals, or for a variety of other materials coating applications.

EXAMPLE 11

There has been described above in Example 10 the deposition of a stress relief or relaxation film consisting of a layer of progressively graded material which matches the material of a substrate to the material of a desired outer coating without any sharp changes in material composition which cause stresses in the film. The use of a self-on-self initial layer, and a flash annealing, to reduce crystal dislocations of the substrate and substrate-coating stresses was described as a further preliminary step This self-on-self step thus minimizes localized stresses which would be caused by deposit of a dissimilar material film.

Figure 11:
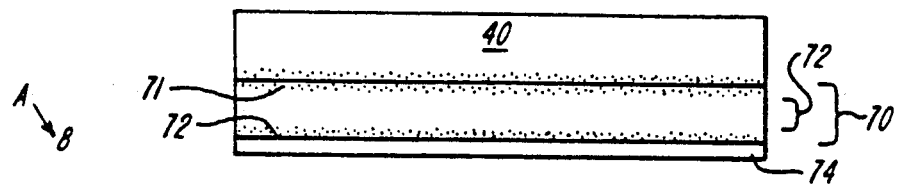
FIG. 11 shows a process for forming a relaxation layer having novel surface energy properties.

In one aspect of applicant's invention, these two sputter deposition steps are followed by the deposition of a third material to achieve large area crystal growth. FIG. 11 illustrates a coating achieved by such a process. A substrate 40, which may be formed of polished, oriented single crystal silicon, or other crystalline or even amorphous material, is sputter coated with a preliminary layer 70 of material to eliminate surface stress. Layer 70 comprises an initial layer 71 of material A, illustratively a self-on-self layer of the same substance as the substrate, and is graded through an intermediate layer 72 having decreasing concentrations of A and increasing concentrations of material B, to a surface layer 73 of material B, to result in a coated board having a stress-free surface transition layer as previously described. The total thickness of coating 70 may be, for example, approximately 3,000 angstroms. A layer 74 is then deposited over layer 73 to achieve the desired crystalline coating. Layer 74 may be simply a continuation of the outer deposit 73 of material B, or may be a coating of distinct material C for which material B at the top surface of the transition region has been physically matched for some purpose.

In one example, an alumina circuit board was sputter-coated with a layer of alumina as a self-on-self deposit, followed by a graded relaxation layer of material graded from alumina to copper, with the sputter deposition of copper continuing to a depth of approximately one mil. After deposition, the coated board was passed through a furnace, reaching a temperature over 800° C., whereupon the copper surface layer was transformed to a polycrystalline copper surface while remaining strongly bonded to the underlying board.

In a related example, a layer of copper was IBS sputtered onto a stainless steel sheet under substantially identical conditions of ion beam energy and background pressure. The resulting densified copper coating was peeled from the substrate to achieve free-boundary, hence stress-free, front and back surfaces. The separated copper film was then passed through the furnace. A different temperatures two effects occurred. First, the free-surface sputtered film crystallized in relatively large flat crystals extending through the film. Nucleation centers appeared to be uniformly spaced approximately several millimeters apart. Second, the film became amorphous, and its area greatly expanded to form a wrinkled surface.

The observed crystalline transformation appeared substantially like the transformation of the copper on the previously described circuit board. This indicates that the alumina-copper relaxation transition layer on the board was effective to promote the growth of large crystals extending through the film. This experiment tends to confirm that the deposition of a graded "relaxation layer" results in a surface with very low free energy due to elimination of boundary-film strain, and provides a stress free undercoating which promotes crystallization of an outer layer deposited thereon.

In forming a crystalline film over a graded relaxation layer as described, several factors are to be born in mind. First, the inner or bottom layer of the relaxation sublayer is preferably energetically sputter deposited in a relatively hard vacuum, so that a strong bond is achieved due to partial implantation of the sputtered material. Both materials of the graded portion of the relaxation layer are so deposited, resulting in a highly uniform and graded coating. The energetic deposition conditions, however, result in compressive stresses, which must be relieved to permit crystallization to occur on the outer surface. While the release of compressive stress is useful to "drive" the crystallization process, excessive compressive strains can prevent proper annealing, can damage the substrate, and can lead to uncontrolled effects. Thus, preferably the outermost portion of the relaxation layer is deposited under less energetic conditions. This may be accomplished, in the illustrated IBS sputter process, by backing off the energy of the ion beam, by increasing the background pressure in the processing chamber to decrease the energy of impact of sputtered material, or by employing a lower-energy deposition technique such as magnetron sputtering or low energy IBS.

One further aspect of the foregoing example merits special note. The copper film had been deposited by ion beam sputtering as a highly densified and somewhat stressed film, with a conductivity in the range of 40-50% of the theoretically predicted value. After annealing at temperatures between 600 and 950° C., the conductivity of the film rose to the range of 75-90% of the predicted value. The final copper film was a malleable, highly conductive film, strongly bonded to the substrate. Lesser improvements in conductivity were noted at about 300° C. in copper films sputter deposited on polymer boards, which could not be subjected to the higher annealing temperatures.

EXAMPLE 12

Various recent attempts to grow diamond crystals have now been reported which employ ion beam sputtering at beam energies of up to about one kilovolt. The processes appear to require high temperatures, and/or involve a number of competing reactions, of which the diamond growth is a relatively small contribution. These processes generally require complicated and little understood additional process steps, such as the controlled addition of a reactive gas, or the provision of simultaneous directional etching by a grazing ion beam, in order for the diamond-forming component to reach a detectable level.

Applicant has found that by ion beam sputtering material from a graphite target with a substantially more energetic ion beam, the dynamics of sputter impact alone can generate conditions for forming a diamond or diamondlike lattice bond. A substantially continuous film having the high and straight infrared transmissivity curve between 2.5 and 50 microns characteristic of diamond has been deposited by directing a 26 KeV argon ion beam at a graphite target and sputtering material therefrom onto a silicon crystal target oriented to receive the sputtered material at substantially normal impact. A second film prepared by additionally putting hydrogen in the ion beam showed a substantially identical transmission curve shape.

Figure 10:
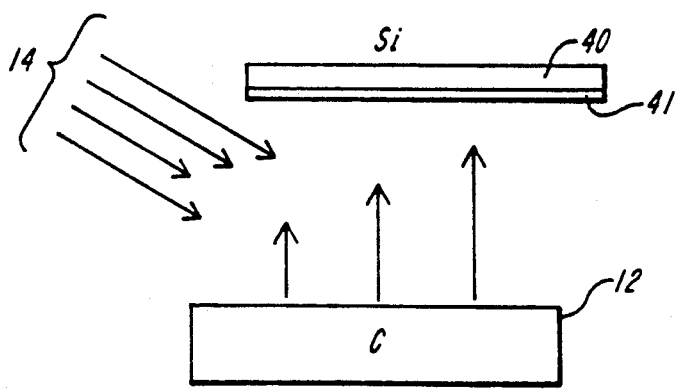
FIG. 10 shows a process for forming diamond-like films.

FIG. 10 shows the arrangement employed. Beam 14 was a highly collimated positive ion argon beam having an energy of 26 KeV and a current density of approximately one ma/cm$^2$. Beam 14 was directed at an amorphous graphite target 12 of 0.99999 graphite at an angle of approximately sixty degrees to the normal. A substrate of (100) single crystal silicon 40 was placed opposite to target 12, and was oriented to receive material at substantially normal incidence in order to maximize the energy of impact.

The process chamber was lined with graphite and the sputtering was carried on for a while to coat the chamber interior with sputtered graphite material so that any areas from which secondary sputtering might occur would not contaminate the film. The substrate was then exposed to the sputtered material, resulting in the formation of the aforesaid film of high infrared transmissivity.

The nature of the described deposition process results in the formation of a compressed surface layer on the substrate of high mechanical strength and rigidity, suitable for the deposition of diamondlike material.

A contemplated process improvement is to employ a target which is formed of densified graphite fabricated by high-energy ion-beam sputtering of material from a commercial graphite target onto a surface. The densified graphite thus deposited on the surface is then used as the sputtering target for forming diamondlike film. Mineral graphite of suitable purity may be used. The use of a densified target is expected to increase the effective transfer of energy from the ion beam to the sputtered material, so that the sputtered material energy distribution is higher. This would allow use of lower ion beam energies for a given energy-dependent process.

The above described process results in the formation of an environmentally hardy, thermally conducting transparent film, which is suitable for encapsulation of circuit boards or devices for diverse uses. When used to form a coating over an assembled circuit board having plural isolated conductive elements thereon, a thin dielectric film formed of alumina or the like is first deposited to maintain electrical isolation of the components, and the diamondlike film is deposited over the dielectric film.

EXAMPLE 13

This example illustrates the versatility of energetic sputter deposition applied to problems of printed circuit board fabrication, and in particular illustrates a process whereby both metal circuit patterns and layers of insulating board material can be formed by sputter deposition, to make a multi-layer printed circuit board of novel materials and construction.

Figure 12:
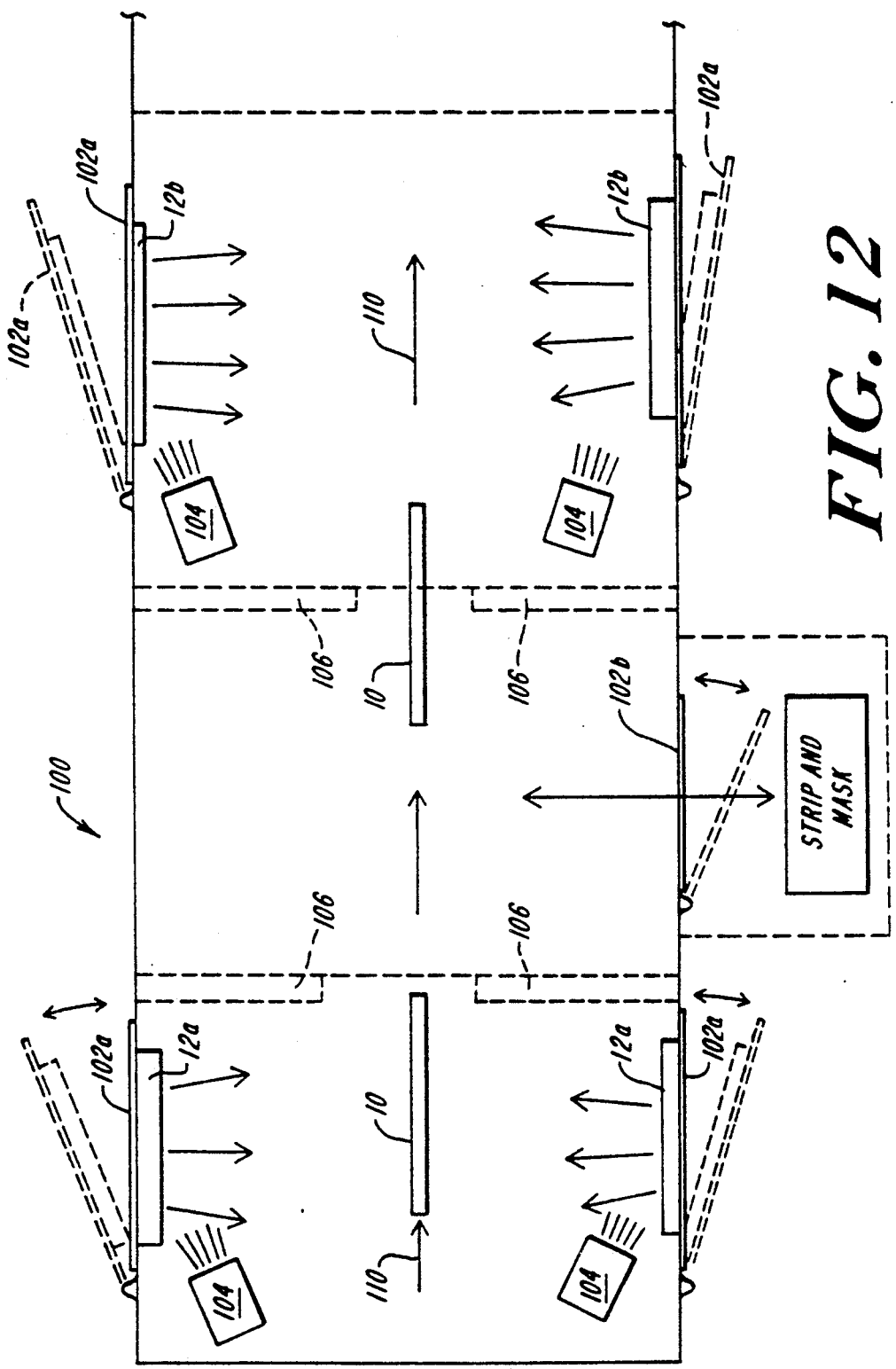
FIGS. 12 and 13(a)–13(h) show a novel board fabrication process.

FIG. 12 illustrates a preferred production line system for carrying out different aspects of the invention of this example. The system includes a process chamber 100 maintained at a vacuum, and having a plurality of ports 102a, with sputtering targets 12a, 12b . . . associated with respective ones thereof, and a further plurality of ports 102b which serve as product access ports for removal or insertion of a workpiece. A conveyor 110 is shown schematically which moves workpieces, shown illustratively as a circuit board 10, along the process line within the chamber. An ion gun 104 directs a beam of ions at each target 12a, 12b, etc. to sputter material from the target in a broad curtain, illustrated by the arrows emanating from the targets, so that as the workpiece 10 moves along the production line sputtered material blankets the workpiece. Vacuum manifolds at various locations maintain the pressure in the process chamber at approximately $5 \times 10^{-5}$ Torr, allowing unimpeded free path trajectories between each ion gun and its associated target, and between each target and the passing workpiece 10, so that the sputtered material reaches the workpiece with a relatively low thermal energy, and with a high component of motion directed at the substrate. Further, the ion beams and the targets are relatively broad, e.g. six inches to several feet or more in extent, so that the sputtered material impinges at each point of the surface of the passing workpiece 10 along a variety of normal and oblique paths to fully coat edges and faces of protrusions and relief features of the workpiece.

For working with some higher molecular weight target materials, and for assuring a high rate of sputtering without degrading the length of the mean free path, applicant has found it particularly advantageous to employ large area high energy ion sources which produce a 1 kV or more, and preferably 5 kV to 100 kV, energetic ion beam. For purposes of this discussion it is sufficient to state that the described apparatus is operated such that the sputtered material reaches the target along substantially directed pathways, and with an energy of impact distributed substantially in the range of 10–100 eV. or higher.

As regards mechanical details of the process apparatus, it will be appreciated that vacuum load locks and device workpiece or target transporting or introduction mechanisms, and the like may be included in the illustrated equipment, of a type which are known from other vacuum processing applications, to more readily achieve the above recited operating pressures and process paths.

Figure 13A:
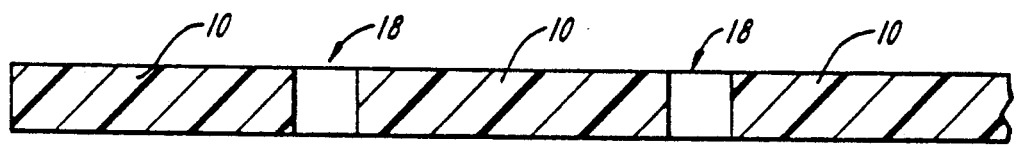

Returning now to the illustrated board fabrication process of this example, FIG. 13(a) illustrates a section through bare circuit board 10 having holes 18 formed therein for receiving circuit elements. This may be an epoxy or other polymeric board, or, as discussed further below, may be an alumina or ceramic board. It will be seen in the following description that the present process contemplates a variety of novel board materials, all treated by the same basic processes.

Figure 13B:
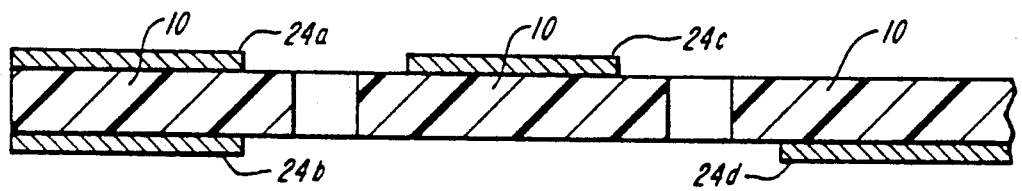

Prior to sputter treatment, board 10 is coated with a resist pattern 24a, 24b, 24c, 24d shown in FIG. 13(b) to define a mask 24 on one or both sides of the board. Mask 24 may be screened, formed by photolithographic techniques, or made by other conventional techniques.

Figure 13C:
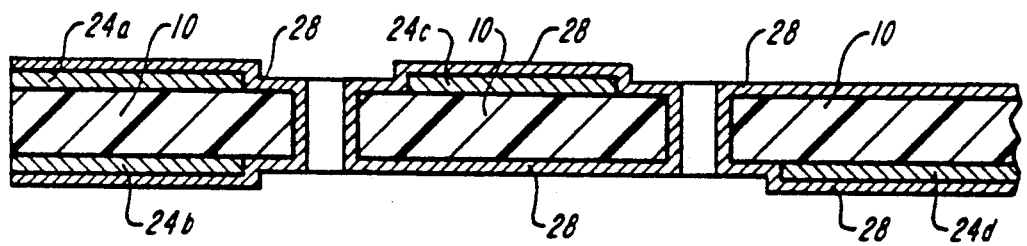

The masked board is then passed into the process chamber where it is sputter-coated with a conductive coating 28 which covers the mask 24 as well as all exposed portions of the board 10. Such a coated board is shown in FIG. 13(c). The conductive coating 28 may be a pure copper coating. Preferably, however coating 28 is formed such that the composition varies with depth, with its lower surface commencing with a substance which facilitates bonding to the board, and its upper (outer) surface containing a substance which alloys with or bonds to any layers which may be deposited thereon in a subsequent step.

Figure 13D:
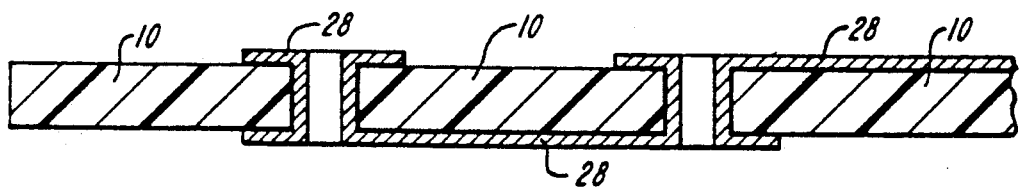

Following the coating step, the board 10 is removed from the process chamber 100 (FIG. 12) through access port 102b and the conductive coating 28 is stripped from the areas of the board covered by mask 24. Since metal 28 is deposited on the board with an energy of ten or more eV, it implants into the board, and adheres with a bonding strength which may be as high as several thousand psi. This is substantially above the resist-to-board bond strength, or the tensile strength of the resist. For this reason, the unwanted portion of layer 28 may be removed by mechanical stripping. One convenient method of removal is to apply a tape having a contact-adhesive coating to the metalized board to pull off the metal over the masked portions. FIG. 13(d) shows the stripped board.

Figure 13E:
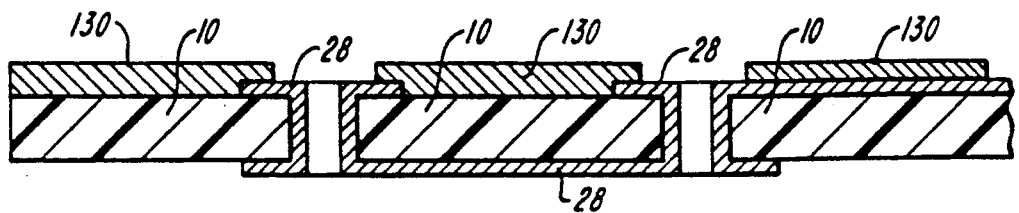

After stripping, any residual resist from the mask is removed by a solvent treatment or cleaning, and a new pattern is formed on the board to build up an intermediate board layer to accommodate further circuit features. FIGS. 13(e) and 13(f)–(h) illustrate two alternative approaches to forming the next board layer. FIG. 13(e) illustrates a layer 130 of a substance, such as a glass frit, deposited in a defined pattern by a process such as silk screening, which is then fired or otherwise hardened in a conventional fashion to form a further board layer. This layer, when hardened may be drilled, masked and metalized to form a further circuit board layer.

Figure 13F:
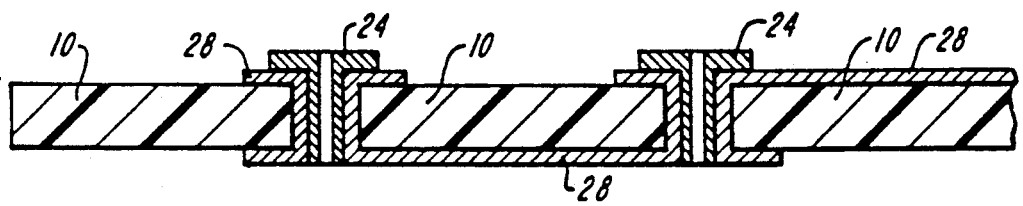

FIG. 13(f) shows the board of FIG. 13(d) which has received another mask pattern of resist 24 to serve as a negative pattern for sputter depositing a layer of glass, ceramic or other electrically insulating material to achieve the same pattern as illustrated in FIG. 13(e).

To effect such a coating, the masked board FIG. 13(f) is re-introduced to process line 100 and carried past a broad-area sputter-emitter target 12b (FIG. 12) to receive a sputtered coating of a suitable material, such as an alumina glass or a ceramic. Preferably an ion beam having an energy of five kilovolts or above is used to sputter the material.

Figure 13G:
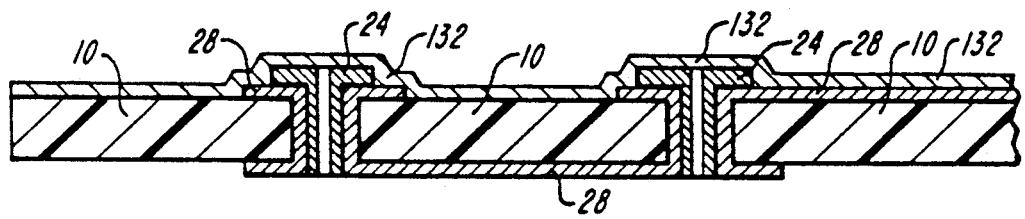

FIG. 13(g) shows the board 10 after coating with a dielectric layer 132. As in the case of a conductive pattern illustrated in FIG. 13(c), the board is then removed from the process chamber a second time, and the portions of the layer 132 overlying the resist or mask 28 are stripped away leaving a glassy sputter deposited film 134 precisely in the regions where it is desired to deposit an insulating layer for receiving further conductive patterns or thin film circuit elements. As before, residual resist is cleaned. The resulting board has a second dielectric layer 134, shown in FIG. 13(h), like the screened frit pattern 130 of FIG. 13(e), except that the regions of dielectric material, being energetically sputter deposited, are dense and firmly bounded to the underlying layers in a substantially continuous, glassy film.

Figure 13H:
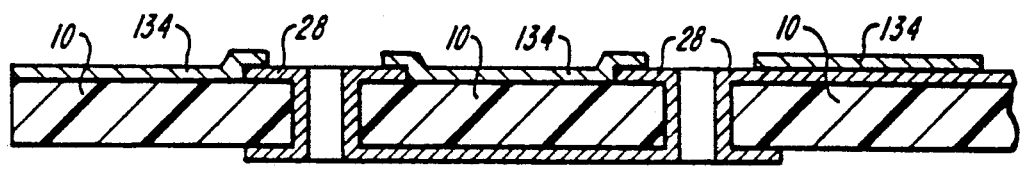

Following the deposit of dielectric layer 130 (FIG. 13(e)) or 134 (FIG. 13(h)) a further metallization pattern may be deposited by the steps described in relation to FIGS. 13(a)–13(d). The sequence of forming intermediate dielectric board layers and circuit patterns is thus continued to build a complete multi-layer printed circuit board with as many dielectric layers and circuit interconnect layers as required. The process described in Example 6 may be used for reliable interconnects on the multi-layer circuit patterns.

A board made according to the foregoing process has several advantages over a board produced by conventional board fabrication techniques, of which a few are noted here. First, the entire process may be carried out at low temperatures, so that multi-layer ceramic boards may be made which incorporate passive circuit elements, such as resistive films, which do not survive current fired-frit board fabrication processes. Second, extremely good inter-layer bonding is achieved, resulting in greater dependability for applications involving thermal cycling or mechanical stress. Also the mechanical stripping of layers from the masked resist eliminates the chemical etch steps required in conventional fabrication processes to selectively remove unwanted coatings in the prior art. This substantially frees the board fabrication process from cumbersome environmental regulations.

Furthermore, by firing the circuit board at a temperature in the range of approximately 800-950° C., a monolithic board of high integrity is obtained, with enhanced conductivity circuit patterns as described above in connection with Example 11.

As previously described, when a multilayer board includes a dielectric layer deposited as a glass frit pattern which is to be fired, or when a multilayer board is intended for an environment of thermal extremes, problems are possible. These problems include differential expansion of the board and circuit layers, leading to delamination, and also include high temperature diffusion of the conductive patterns leading to shorts and open circuits. In general, a suitable material for forming the board should be selected to have high thermal conductivity, low dielectric constant and high dielectric strength, impermeability to the conductive materials, and suitable high temperature operating characteristics.

Many glasses or ceramics meet a number of these criteria, and in Example 5 above a co-sputtering process was described wherein any combination of desirable physical characteristics (illustrated in that Example by low dielectric constant and high thermal conductivity) are achieved by simultaneously sputter-depositing two different materials, at least one having an extreme value of a characteristic which is deficient in the other material. While this method solves the problem of achieving suitable board materials, the problem of thermal matching to the conductive material cannot be so solved, because the conductors have quite different attributes, with a very high thermal coefficient of expansion, and the conductors and dielectric cannot be "mixed" with each other in that manner without impairing their essential physical properties.

Thus, there is a problem of thermal matching between conductors and substrate. This thermal matching problem is solved in a further aspect of the invention briefly indicated above, by depositing the conductive patterns with a material composition profile at the bottom and top surfaces thereof calculated to effect a good bond with surrounding layers. In a presently preferred embodiment this is achieved by forming relaxation layers, as described in Example 10 above, with titanium as a principal component.

Figure 14:
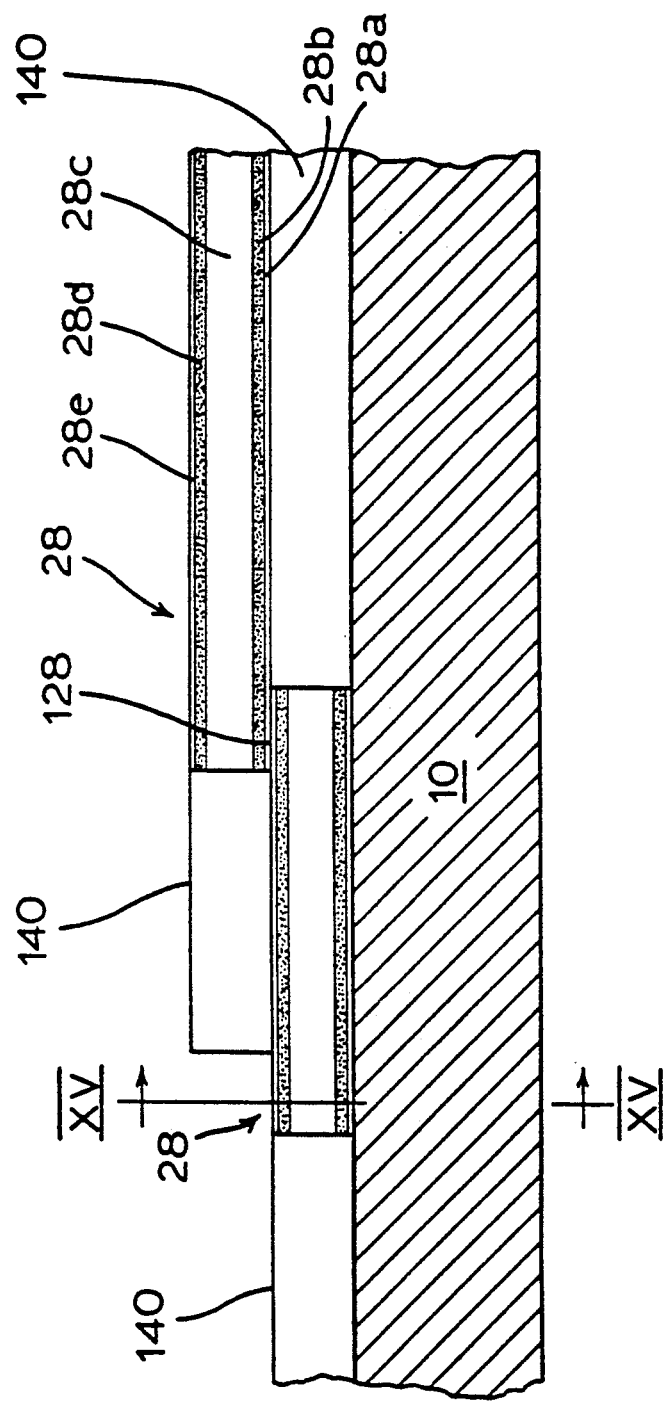
FIGS. 14–16 illustrate methods for the fabrication of printed circuit boards according to aspects of the invention.

FIG. 14 illustrates a section through a multilayer circuit board fabricated in this manner. A board substrate 10 has multiple layers 140, 28 deposited in overlying patterns, where layers 28 are conductive patterns and 140 are dielectric layers, such as the glass frit 130 or sputtered dielectric 134 of FIGS. 13(e) and 13(h). Dielectric layers 140 maintain the conductive patterns of different layers isolated except at regions 128 where circuit interconnection is intended. As shown, in this preferred embodiment each conductive pattern 28 is deposited as a layer including successive sub-layers 28a, 28b, 28c, 28d, 28e.

Figure 15:
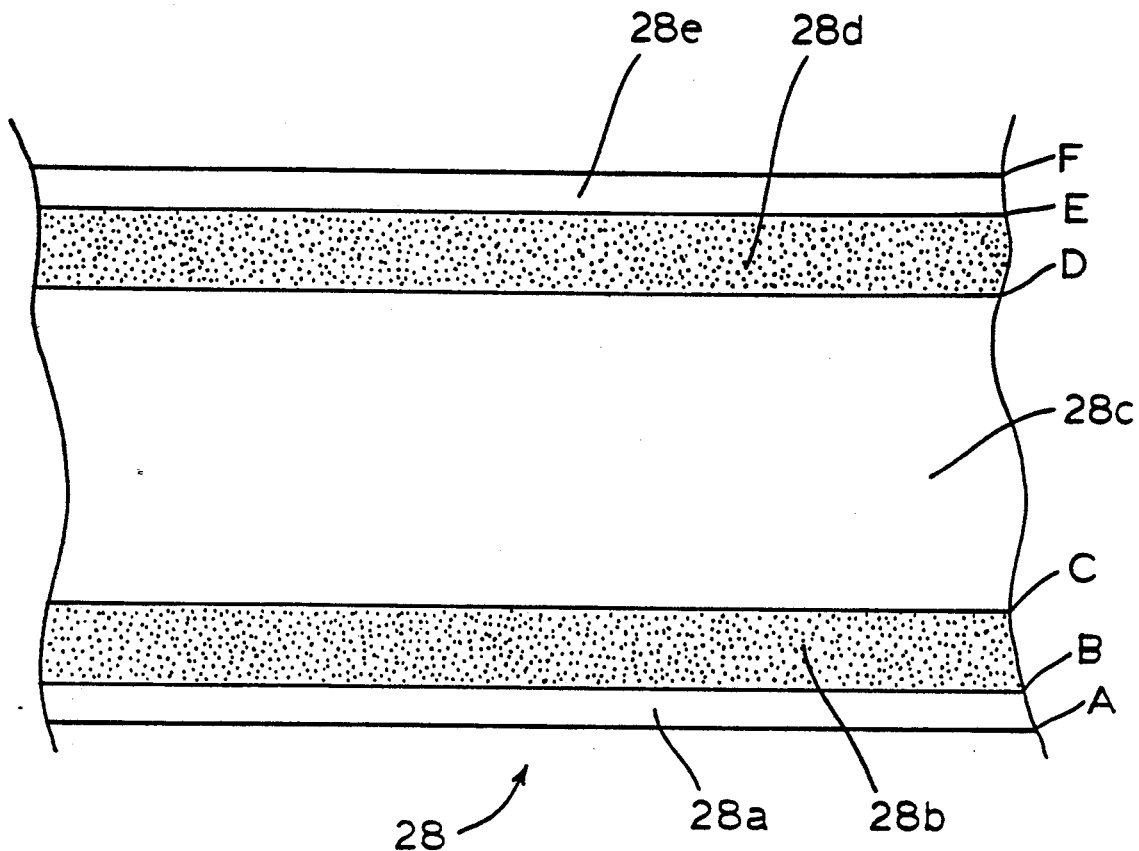
Figure 16:
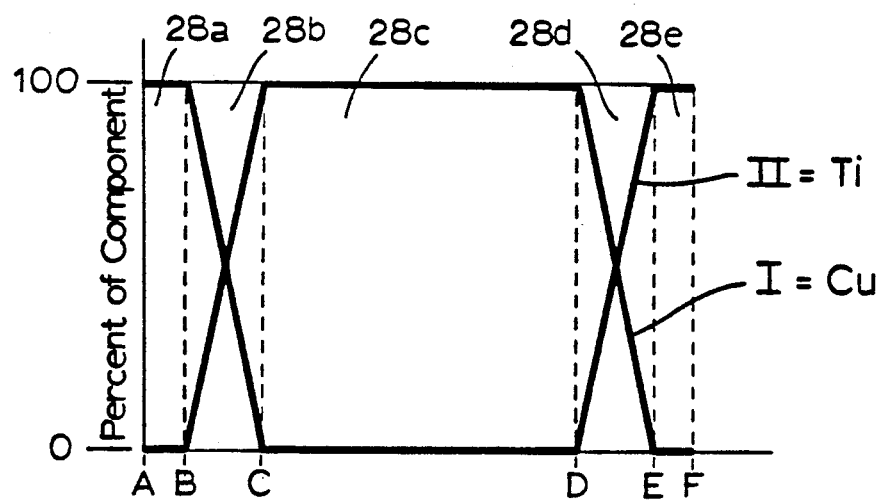

FIG. 15 is an enlarged vertical selection through layer 28 of FIG. 14, illustrating graphically a sequence of varying composition of two different metals which are sputtered to form the layer. The five sub-layers are demarcated by successive letters A, B, C, D, E, F, with A and F corresponding to bottom and top faces of layer 28. FIG. 16 shows a graph of the composition of the sub-layers as a percentage of each of two components designated component I and component II. Component I is principally a conductor, e.g. copper or aluminum, and component II is principally selected for alloying with the conductor at a relatively low heat or upon implantation sputter deposition, as well as for forming a good bond to the board and dielectric materials 10, 140. As disclosed in Examples 2, 6 and 10 above, titanium is a presently preferred material for component II.

As illustrated in the graph, FIG. 16, an essentially pure copper conductive layer 28c is symmetrically surrounded on each face by a relaxation layer 28b, 28d of graded composition, which is jacketed by a corresponding outer layer 28a, 28e of the bonding/alloying component II, preferably titanium. Applicant has found that with this composition, an excellent bond to layers 140 is achieved, and the different conductive patterns 28 form a good electrical interconnection at their points of contact, such as 128.

Specifically, for ceramic substrates, by heating the completed multilayer board to a temperature in the range of 600° to 900° C. the contacting conductive patterns will alloy-bond to each other. This heating step may be the same step used to fuse a frit-deposited dielectric layer (130, FIG. 13(e)) in the event the dielectric portions of the board are formed by a frit-screening and heat fusing process. Such heating also causes the layers 28a, 28e to bond to the dielectric layers since applicant has found sputter-deposited titanium forms an excellent bond with ceramics and glasses as well as the polymers described above. When the dielectric layer is a sputter-deposited one, like layer 132, 134 of FIGS. 13(g) and (h), the energy of sputter deposition together with a subsequent heating step assures a good bond to the dielectric. This procedure forms an integral block of high strength and reliability. After fabrication, the outer conductive layers can be sputter coated with aluminum, using a preliminary relaxation layer if desired to achieve ultrasonically bondable conductive lands.

As in the processes described in Example 10 above, other conductive materials, and graded coatings with other "active" metals or bonding components may be employed to achieve interlayer thermal stress relief and improved bonding characteristics, within the general concept of applicant's board fabrication process disclosed in this Example.

EXAMPLE 14

In providing antireflective coatings for optical elements, nulling of reflective effects is achieved for light of wavelength $\lambda$ by providing a coating of thickness $\lambda/4n_1$, and index of refraction $$n_1 = \sqrt{n_2 n_0},$$

where $n_2$ and $n_0$ are the indices of the media on each side of the coating. When the surrounding medium is air, $n_0 = 1$ and this condition reduces to $$n_1 = \sqrt{n_2}.$$

Many modern applications require optical elements formed of materials such as cadmium telluride, zinc sulfide or like substances which have indices of refraction substantially differing from, for example higher than, conventional glasses, and higher than the square of the index of known hard antireflection coating materials.

In accordance with one aspect of the present invention, an antireflection coating of index $n_1$ is matched to such an optical element by first sputter depositing a coating on the optical element to achieve an outer surface of index $(n_1)^2$. A $\lambda/4n_1$ antireflection coating of index $n_1$ is then deposited.

Figure 17:
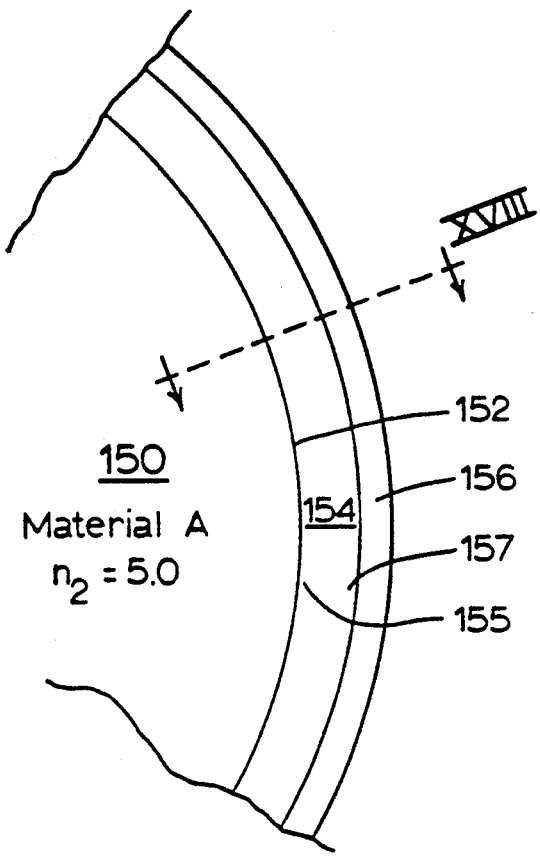
FIGS. 17–18 illustrate an antireflection coating method according to aspects of the invention.

FIG. 17 illustrates this process. An optical element 150 formed of a material A with refractive index 5.0 is shown having a nominal face 152. Element 150 may be a lens, a radiation sensor or other element for which it is desired to minimize reflection at surface 152. A transition coating 154 having a bottom stratum 155 and top stratum 157 is deposited on face 152.

Briefly, coating 154 is made so as to have no reflective boundary at face 152, and to have an index of refraction matched to a subsequent antireflection (AR) layer which is to be deposited at its top stratum 157. These properties are achieved by selecting a transition grading substance of a material B which is transparent to the intended optical spectrum and which has an index of refraction $n_b \leq (n_1)^2$, where $n_1$ is the index of the intended A coating material.

The layer 154 is then deposited by sputter depositing from sputtering targets in a process wherein element 150 is exposed to pure material A, forming stratum 155, and is then exposed to sputtered material which consists of progressively greater concentrations of material B, so that composition of layer 154 varies and the index of refraction of layer 154 progressively decreases from $n_2$. The coating process is controlled so that the proportions of materials A and B at stratum 157 have an index of refraction approximately $(n_1)^2$. An AR coating 156 of index $=n_1$ and a thickness of $\lambda/4n_1$ is then applied, resulting in a matched antireflective coating.

Figure 18:
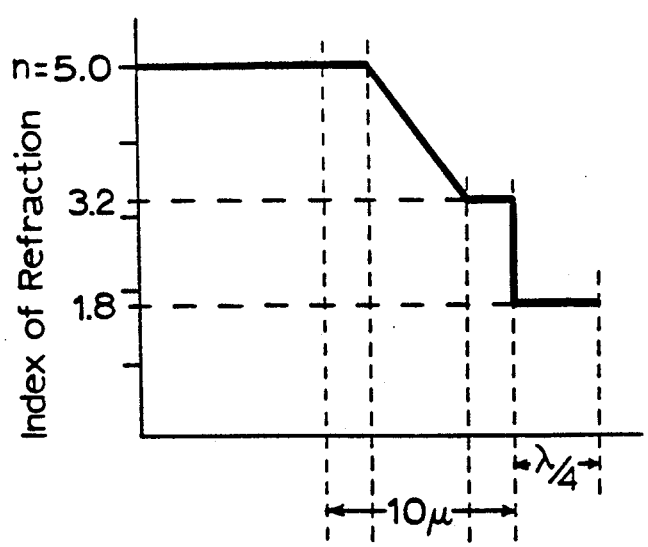

FIG. 18 shows a graph of the index of refraction across the surface of the coated optical element 150 of FIG. 17, with an AR coating of index 1.8. A transition layer which is preferably selected of a thickness relative to the wavelength of the intended light so as to not form an abrupt transition in index is shown with a graded index achieved by co-sputtering a low index material such as alumina (n=1.76) with material A (n=5.0) to form an index matching layer free of index discontinuities and having an index at its outer surface which is the square (n=3.24) of the desired antireflective coating (n=1.8).

While precise measurements to confirm the predicted properties of such processes for particular examples have not been carried out, it is believed that a broad range of conventional transparent materials, such as alumina, silica or different glasses may be readily used as material B additives to achieve index-square matching to a number of conventional AR coating materials.

In addition, the invention contemplates the formation of hard protective coating layers by energetic ion beam sputtering of materials such as aluminum nitride, compressed or diamondlike carbon, and densified glasses of the types described in preceding examples. Each of these materials may serve as an AR coating, and suitable index matching will be achieved by selection of an appropriate "B" material additive for a given AR coating and optical element material.

It will be understood that the index of refraction of a given bulk material will not necessarily be the index of the corresponding sputtered material, and a preliminary determination of the indices of sputtered A and B material films should be performed before selecting the B material and determining the approximate desired proportions for stratum 157.

As may appreciated, the present invention further contemplates forming the transition layer 154 and the AR coating 156 by processes other than sputter deposition. For example, the transition layer may be formed in the optical element itself by a sodium glass diffusion process, or by adapting a conventional process for forming gradient index material in order to form a graded-index "skin" on the optical element 150. Further, the AR coating may be vapor deposited on the matching layer 154 in a conventional manner. Energetic sputter deposition as discussed elsewhere in this description, however, is the presently preferred process for practicing the invention, as it offers high adherence and physical strength and low temperature processing conditions, as well as precise control of material composition.

EXAMPLE 15

This example describes a method of forming high molecular weight crystalline materials, such as the crystalline yttrium/barium/copper oxide compounds which have recently been identified as high temperature superconducting materials.

Figure 19:
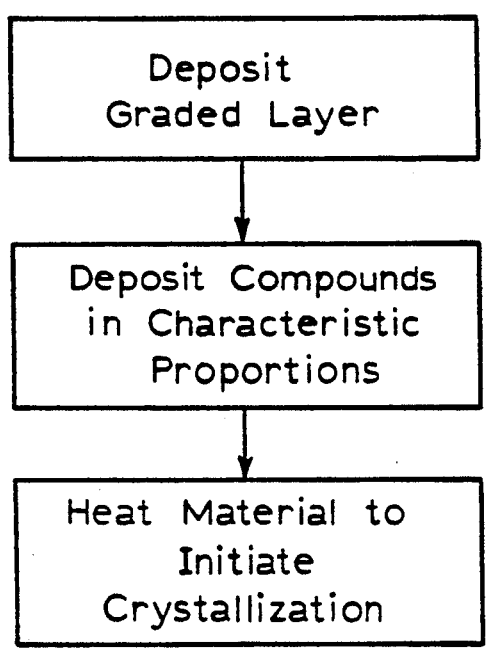
FIG. 19 illustrates a method of forming crystalline films of complex molecular structure.

The method is illustrated in FIG. 19, and includes three steps. The first step is the sputter depositing of a relaxation layer onto a substrate, as described in Example 10. The relaxation layer is graded from the substrate material to a desired surface material, described further below.

As a second step, the surface material, which has the same bulk composition as the desired crystalline material is formed to a desired thickness by sputtering a number of different metal oxides by high energy ion beam sputtering, as described in various examples above. The energetic deposition advantageously deposits material in entire molecules, and results in sufficiently energetic surface contact to partially implant the sputtered material, inhibiting migration or clustering of the deposited material and thus resulting in a highly uniform coating. The different metal oxides are selected such that the material deposited at the substrate has the correct proportions of each component element, and preferably such that entire molecules of each metal oxide (which are sputter-transported with their molecular structure intact, as described in Examples 3 and 4 above) correspond to major portions of the crystal structure of the desired crystal compound. For example, it is expected that if a trioxide or pentoxide of a metal having a structure homologous to a portion of the desired crystal is used as the sputtering material, this will enhance crystal formation. Current research indicates that many superconducting crystals have a stratified structure. The present invention contemplates selectively depositing different component materials in incremental layers to promote combination in such a stratified structure.

The desired crystal structure will generally be known from crystallographic analysis of previously identified crystals of the desired material. This second sputtering step results in a film in which the "ingredients" of the desired compound are uniformly and intimately intermixed on a molecular level, and are also under a certain amount of compressive stress due to the energetic sputter deposition conditions. The sputter deposition is preferably conducted with a cooled substrate, to prevent fractionation or breakdown of the deposited materials.

Finally, as a third step, the deposited material is heated to release the compressive strains and initiate crystallization of the film. This results in the formation of a crystalline surface film.

In light of the discussions above, it will be appreciated that the precise proportions of each metal, metal oxide or other ingredient may be varied by suitable alterations of target geometry, such as orientation and spacing, allowing very accurate process control. The method contemplates the simultaneous sputtering from one or more targets of at least two materials selected from the following metals and their oxides: yttrium, barium, calcium, thallium, copper, samarium, bismuth, lanthanum and strontium.

It should be noted that much current research into the growth of superconducting crystals is performed by an empirical trial-and-error method, in which hundreds of microscopic crystals are tested for superconducting properties, a few successful crystals are found and analyzed, and growth conditions of a reactive vapor or other growth process are then methodically varied to find conditions which produce a crystal similar to a previously identified crystal.

The crystal synthesis process of the present invention is considered a distinct improvement because by using an energetic ion beam to sputter whole molecules, one achieves a high flux of material, which is directed, as in molecular beam epitaxy, but which provides larger structural components having a more immediate relationship to the overall crystal structure of the intended product rather than relying on the lower rate combination of individual elements of a molecular beam. Further, more precise and repeatable reaction concentrations are obtained, and temperature gradients and variations can be practically eliminated from the reaction parameters.

EXAMPLE 16

Applicant has found that the alteration of surface properties by energetic sputter deposition can be applied to a number of bulk articles with favorable results.

As one example, the surface properties of teflon film have been so modified, to permit its use with adhesives, creating a "bondable" teflon. Prior art attempts to provide a teflon film which can be adhered to a surface have required a chemical treatment of the teflon film, and have required the use of particular adhesives which are relatively prone to degradation. In accordance with the present invention, a teflon film is made "bondable" by depositing a glass on the film to a depth of 100 to 1,000 Angstroms. The surface of the film is thus transformed so that it may be reliably bonded using conventional adhesive bonding techniques. The glass may be deposited on the film in a continuous manner by passing the film from a supply roll, through a sequence of partially evaporated regions into a central vacuum processing chamber maintained at a suitable deposition vacuum, and sputtering the glass thereon as described above. The glass layer is firmly and uniformly adhered, and covers the surface to a sufficient depth to entirely alter the surface bonding properties of the film.

As another example, a plastic film is made sufficiently conducting to prevent the build-up of static charge. This is accomplished by the deposition of a metal thereon. In a presently preferred process of this type, applicant has ion beam sputtered tantulum onto a plastic film using a 15 kV argon ion beam directed at a tantalum target to energetically deposit a 10-50 angstrom layer of metal. The resulting film was free of static, and in other practical respects appeared identical to the original film. A sufficient amount of tantalum was deposited that the film surface was clearly imaged by electron micrography. Other metals could be used, but tantalum was selected for its low toxicity and ready availability.

The resulting coating in each case described was transparent and of a thickness which did not alter the mechanical properties of the film itself, yet entirely changed the surface chemistry and the related physical surface properties of the film in a manner correlated with the deposited coating material.

EXAMPLE 17

As a practical application of several of the preceding examples, applicant has deposited a film of aluminum nitride in thicknesses up to ten microns as a protective transparent window over an optically flat zinc sulfide substrate.

This was done as follows. Using a 15 kV ion beam of nitrogen, material was sputtered in a hard vacuum onto the substrate. Specifically, a zinc sulfide-to-aluminum nitride relaxation layer was formed by advancing an aluminum nitride target over a zinc sulfide target in the beam path, so as to progressively vary the proportions of the two sputtered materials. In this manner, a dense sputter-deposited zinc sulfide coating, of greater hardness than the bulk substrate, was deposited first and graded into a pure aluminum nitride layer. The aluminum nitride sputtering was then continued to a suitable depth.

The resulting coating resisted scratching by a silicon carbide scribe, and tests conducted on earlier AlN-only films showed extremely flat optical transmission curve in the 1-10 and 35-50 micron ranges. The coating thus provided an excellent hard window coating for the zinc sulfide sensor material having transparency in these regions of the spectrum.

A similar process is expected to work using boron nitride instead of aluminum nitride as the coating material, and preliminary unanalysed films have been made of boron nitride using an argon beam. For pure boron nitride films, optical transparency is expected in certain regions of the spectrum above ten microns in which the aluminum nitride appears to absorb light. The invention contemplates fabricating such nitride films as hard encapsulants or windows on arbitrary substrates.

As noted above, it is not necessary to employ a pure nitrogen ion beam, but at the energies employed applicant has found that at least 80-90 percent nitrogen appears necessary to form AlN films of sufficient purity. It is theorized that a surface nitrogen enrichment effect at the target minimizes the sputtering of dissociated aluminum which can contaminate the film when sputtering is performed using an ion beam of noble element ions only, or using lesser proportions of nitrogen.

Thus, the composition of the ionizing gas provides a method of varying the composition of sputter deposited material. A contemplated process is to sputter deposit AlN from an aluminum target with a predominantly nitrogen beam, decrease the nitrogen and substitute a gas such as argon to slowly change the composition of sputtered material to pure aluminum. One may optionally then introduce a target of nickel or the like to provide a desired outer coating such as a brazeable barrier coating. The invention thus contemplates the formation of metal conductive layers and metallic compound dielectric layers of the same metal by varying the feed gas.

This completes a description of the illustrated ion treatment methods according to the invention, and of illustrative structures for effecting exemplary types of ion treatment. It will be understood, however, that the foregoing description of the illustrated embodiments is intended to be illustrative of the invention but not in limitation thereof. The preferred embodiments and novel attributes being thus described, variations and modifications of the apparatus and methods of treatment will occur to those skilled in the art, and all such variations and modifications are included within the scope of the invention, as defined by the claims appended hereto.

What is claimed is:

1. A method of depositing a layer of dielectric material which has plural different physical characteristics such as refractive index, thermal conductivity, dielectric constant, hardness, dielectric strength and permeability each lying in a specified range, such method comprising the steps of
    selecting a first material having at least a first set consisting of some of the plural characteristics with values in the specified range and one remaining characteristic having a value not in the specified range, and
    selecting a second material having a value of said one remaining characteristic in a sufficiently different range such that said first and second materials may be codeposited to form a layer having said one remaining characteristic in the specified range, and
    ion beam sputter depositing with an ion beam energy over approximately five thousand electron volts, the first and second materials is a proportion calculated to form a layer of composite first and second material having the values of all characteristics including the one remaining characteristic in the specified range.

2. The method of claim 1, wherein one of said first and second materials includes alumina.

3. The method of claim 1, wherein said first and second materials have high conductivity and low dielectric constant, respectively.

4. The method of claim 1, wherein one of said first and second materials includes boron nitride.

5. An article having a film of aluminum nitride formed thereon, characterized in that said film is essentially transparent to electromagnetic radiation of one to ten microns wavelength, and is electrically insulating, and is sputter deposited by ion beam sputtering of material from a target with an ion beam energy over 5 KeV effective to sputter intact molecules of material which reach the article with a kinetic energy of several to several hundred electron volts so that such material is deposited in a dense continuous film adhering to the article in a total thickness over several microns.

6. The article of claim 5, further comprising a zinc sulfide underlayer codeposited with said aluminum nitride layer and forming a graded coating which decreases in concentration toward the surface.

7. An improved antireflection coating for covering a surface of an optical element, such antireflection coating comprising
    a $\lambda/4$ antireflection layer having index of refraction $n_1$, and
    a layer of sputtered material having a first portion contiguous with said surface, and extending to a second portion defining a boundary with said $\lambda/4$ antireflection layer, wherein said first portion is formed of a material having an index of refraction substantially matched to that of said optical element, and said second portion is formed of a material having an index of refraction approximately equal to $(n_1)^2$.

8. The improved antireflection coating of claim 7 having an index of refraction which is graded between said first portion and said second portion.

9. The improved antireflection coating of claim 7 wherein said surface portion is formed of a material harder than said optical element.

10. The improved antireflection coating of claim 7 wherein said first portion includes a highly thermally conductive material for dissipating heat energy evolved at the surface of the optical element.

11. A method of forming an antireflection coating having a $\lambda/4$ surface layer of index $n_1$ on an optical element of index $n_2$, comprising the steps of forming a light transmissive layer on said optical element having an index which is graded from $n_2$ at said optical element to approximately $(n_1)^2$, and forming said $\lambda/4$ surface layer thereon, thereby achieving an antireflection layer having no internal boundary layer.

12. A method of forming a hard coating on a substrate, such method comprising the steps of
    providing a vacuum processing chamber,
    directing an ion beam at a target located in said chamber, said target having a metal nitride surface and said ion beam having an energy effective to sputter material from the target with an energy distribution substantially in the range of one to several hundred electron volts,
    arranging said substrate opposite said target to receive the material sputtered therefrom, and
    maintaining the pressure in said chamber below approximately $10^{-4}$ Torr so that said sputtered material is deposited on the substrate with its sputtering energy substantially undegraded forming a metal nitride surface film.

13. The method of claim 12, wherein said beam includes nitrogen and has a beam energy above approximately 10 kV.

14. The method of claim 13, wherein said beam further includes a heavy noble gas in an amount less than said nitrogen.

15. The method of claim 12, wherein said metal nitride is selected from the nitrides of aluminum or boron.

16. The method of claim 12, wherein said metal nitride is transparent in a selected spectral region and said film is a protective window.

17. The method of claim 12, wherein the target is a metal target, and the step of directing an ion beam at the target includes directing nitrogen ions at the target to form the metal nitride surface.

18. The method of claim 17, wherein the ion beam comprises over eighty percent nitrogen.

19. The method of claim 12, further including the steps of directing the ion beam at a zinc sulfide target and co-sputtering zinc sulfide and the metal nitride in decreasing and increasing proportions, respectively, to form a graded transition layer between a zinc sulfide underlayer and a metal nitride surface.

20. The method of claim 19, wherein said metal nitride is selected from among aluminum and boron nitride.

* * * * *